United States Patent
Chen et al.

(10) Patent No.: US 11,917,801 B1
(45) Date of Patent: Feb. 27, 2024

(54) ELECTROMAGNETIC INTERFERENCE SHIELD

(71) Applicant: HEWLETT PACKARD ENTERPRISE DEVELOPMENT LP, Spring, TX (US)

(72) Inventors: Yuying Chen, Beijing (CN); Yuhai Guo, Beijing (CN); Kehui Cai, Beijing (CN)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 18/309,061

(22) Filed: Apr. 28, 2023

(51) Int. Cl.
    *H05K 9/00* (2006.01)
(52) U.S. Cl.
    CPC ......... *H05K 9/0026* (2013.01); *H05K 9/0032* (2013.01)
(58) Field of Classification Search
    CPC .................................................... H05K 9/0032
    See application file for complete search history.

(56) References Cited

U.S. PATENT DOCUMENTS

| 4,370,515 | A * | 1/1983 | Donaldson | H05K 9/0032 174/DIG. 35 |
|---|---|---|---|---|
| 6,121,546 | A * | 9/2000 | Erickson | H05K 9/0032 361/752 |
| 7,504,592 | B1 | 3/2009 | Crotty, Jr. | |
| 10,172,265 | B2 | 1/2019 | Wrona et al. | |
| 10,653,048 | B1 * | 5/2020 | Green | H05K 9/0032 |
| 2002/0166683 | A1 * | 11/2002 | Shlahtichman | H05K 9/0032 174/363 |
| 2002/0185294 | A1 * | 12/2002 | Shlyakhtichman | H05K 9/0032 174/387 |
| 2007/0094977 | A1 * | 5/2007 | Zuehlsdorf | H05K 9/0032 52/480 |
| 2007/0210082 | A1 * | 9/2007 | English | H05K 9/0032 220/4.21 |
| 2008/0080160 | A1 * | 4/2008 | English | H05K 9/0032 361/818 |

(Continued)

OTHER PUBLICATIONS

Aruba, "AOS-CX 10.11 Command-Line Interface Guide 6300, 6400 Switch Series", Edition: 3, Apr. 2023, 8 Pages.

(Continued)

*Primary Examiner* — Hung V Ngo
(74) *Attorney, Agent, or Firm* — Jones Robb PLLC

(57) ABSTRACT

An electromagnetic interference (EMI) shield may include a frame configured to be coupled to a printed circuit board (PCB). The frame may include a horizontal body and a plurality of vertical walls extending perpendicularly from the horizontal body. The plurality of vertical walls defines a portion of a perimeter of the EMI shield, the perimeter including a concave corner defined virtually by a first and second vertical wall of the plurality of vertical walls. The first vertical wall does not extend all the way to the second wall and an opening if formed between. The first vertical wall includes an attached portion connected to the horizontal frame and an extension portion connected to the attached portion by way of a first fold. The extension portion at least partially overlays, abuts, and extends beyond the attached portion toward the second wall thereby at least partially covering the opening.

23 Claims, 11 Drawing Sheets

(56) References Cited

U.S. PATENT DOCUMENTS

| | | | | |
|---|---|---|---|---|
| 2008/0179086 A1* | 7/2008 | English | ................ | H05K 9/0032 |
| | | | | 174/384 |
| 2012/0193136 A1* | 8/2012 | Vinokur | ............... | H05K 9/0032 |
| | | | | 29/592.1 |
| 2017/0172019 A1* | 6/2017 | Kurz | .................... | H05K 7/2039 |
| 2017/0215306 A1* | 7/2017 | Lim | ......................... | H01R 4/64 |

OTHER PUBLICATIONS

Digi-Key Electronics, "Harwin Inc. S0921-46R," retrieved online Jan. 25, 2023, https://www.digikey.in/en/products/detail/harwin-inc./S0921-46R/10059437?cur=INR&lang=en, 5 pages.

Laird Technologies Inc., "Board Level Shields," EMI Essentials, May 26, 2016, https://www.laird.com/sites/default/files/2018-11/Board_Level_Shields.pdf.

* cited by examiner

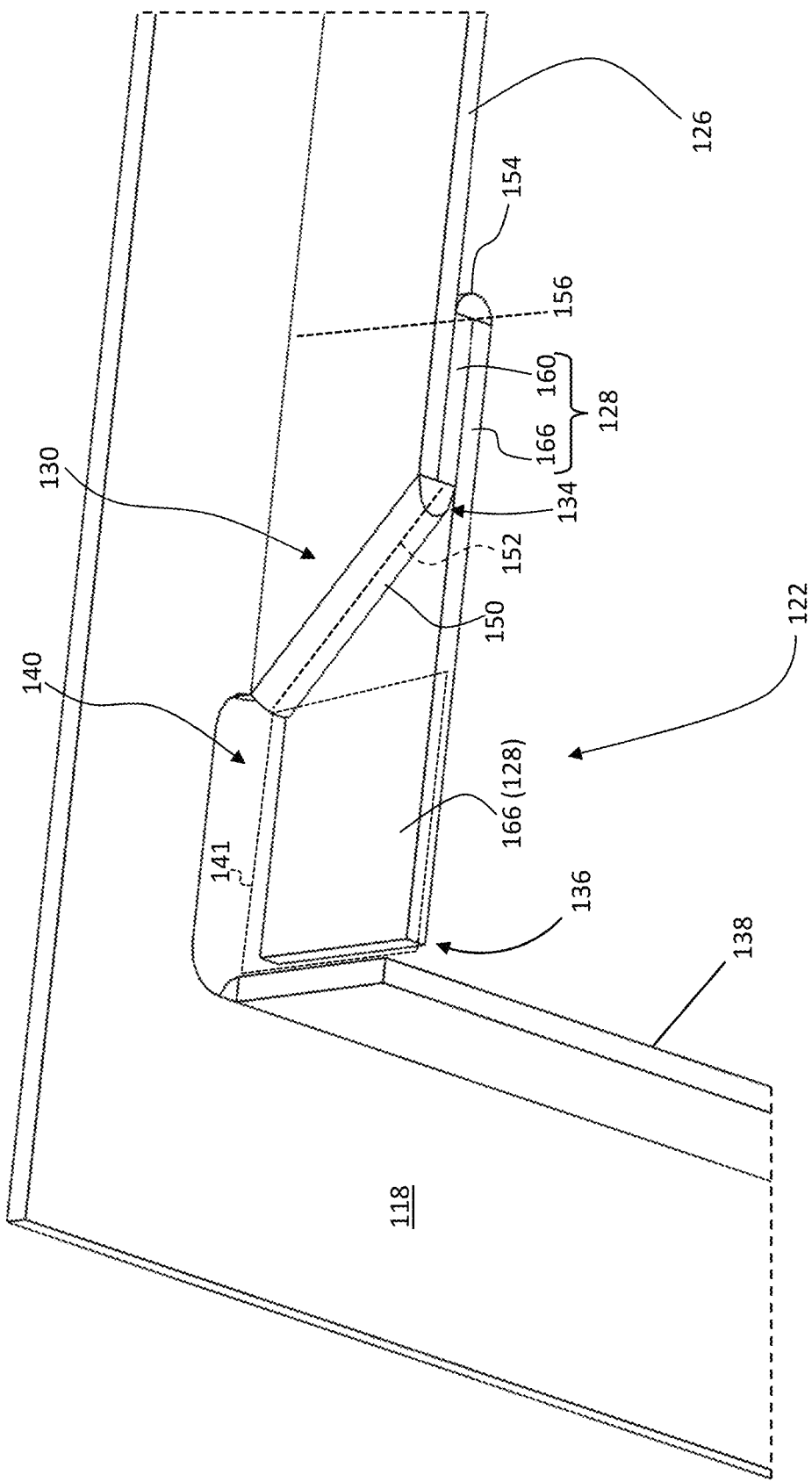

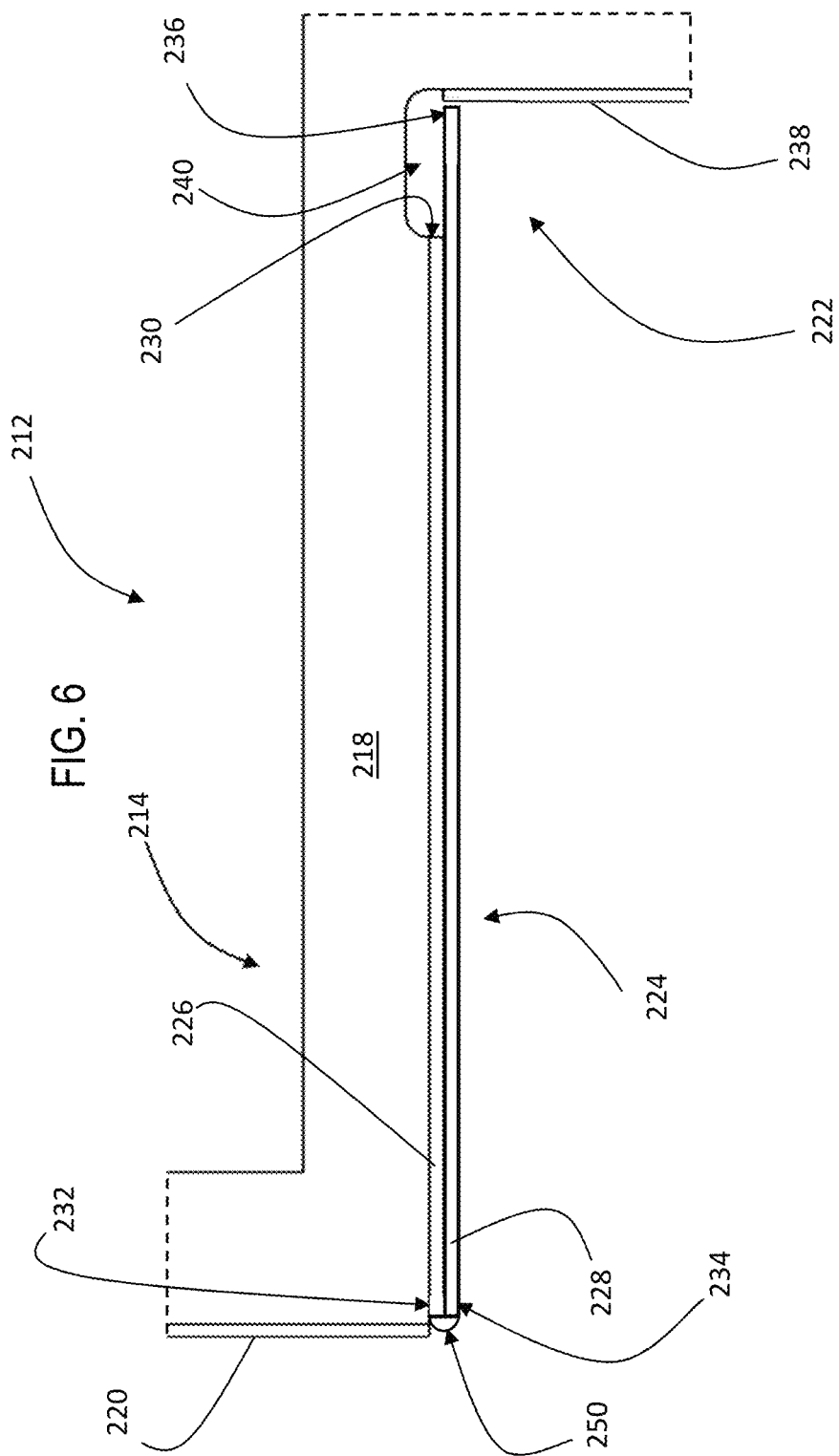

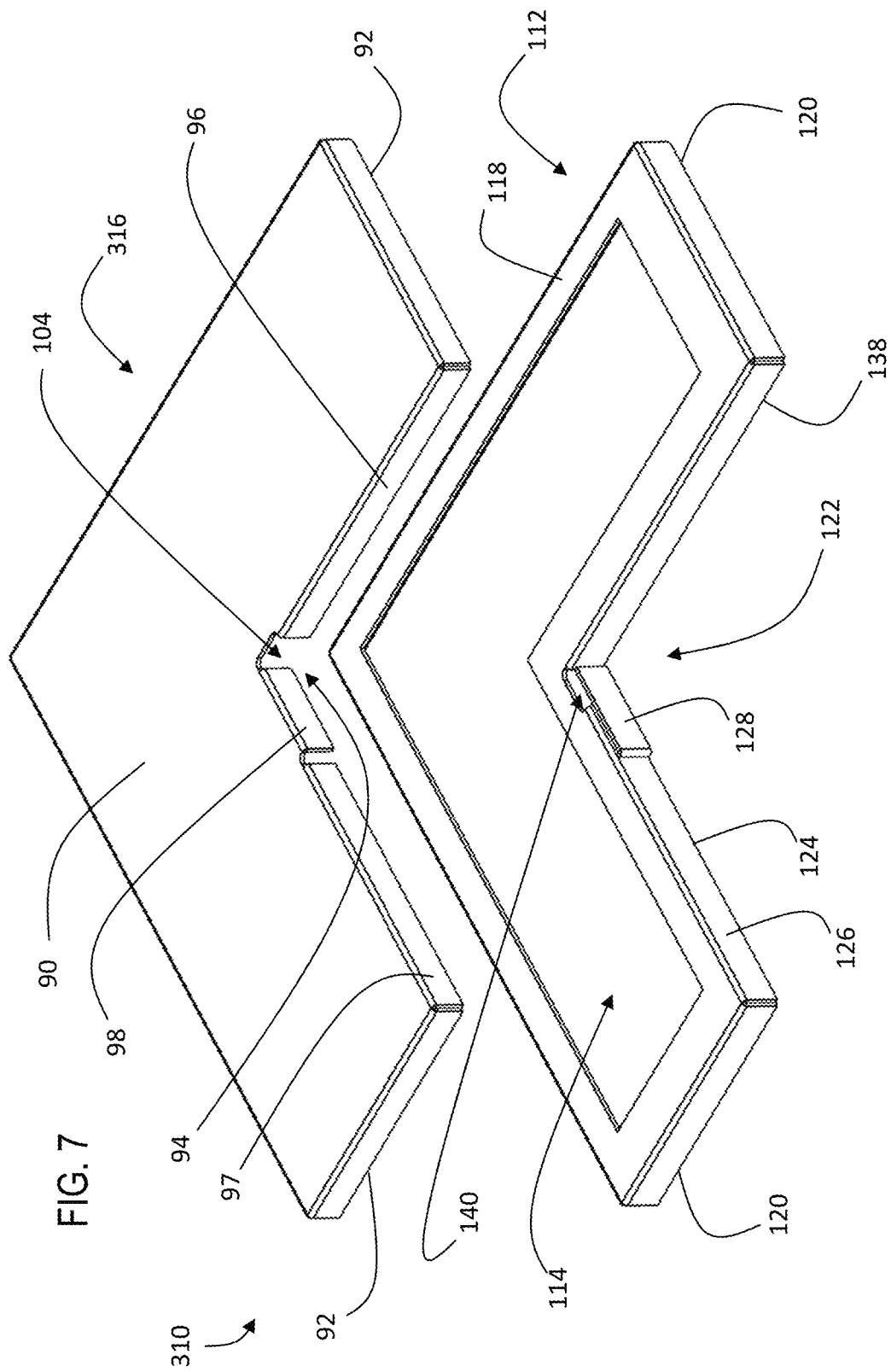

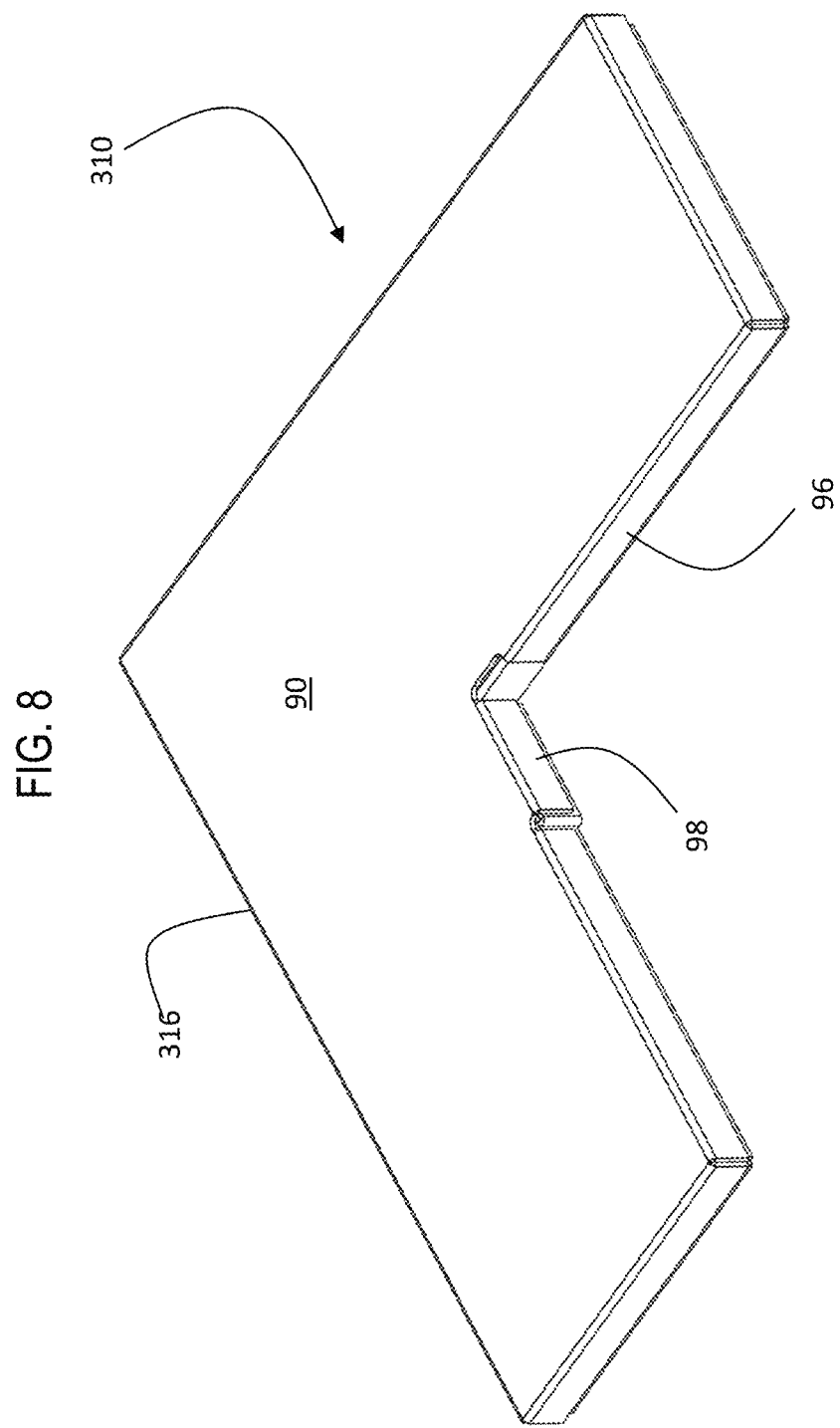

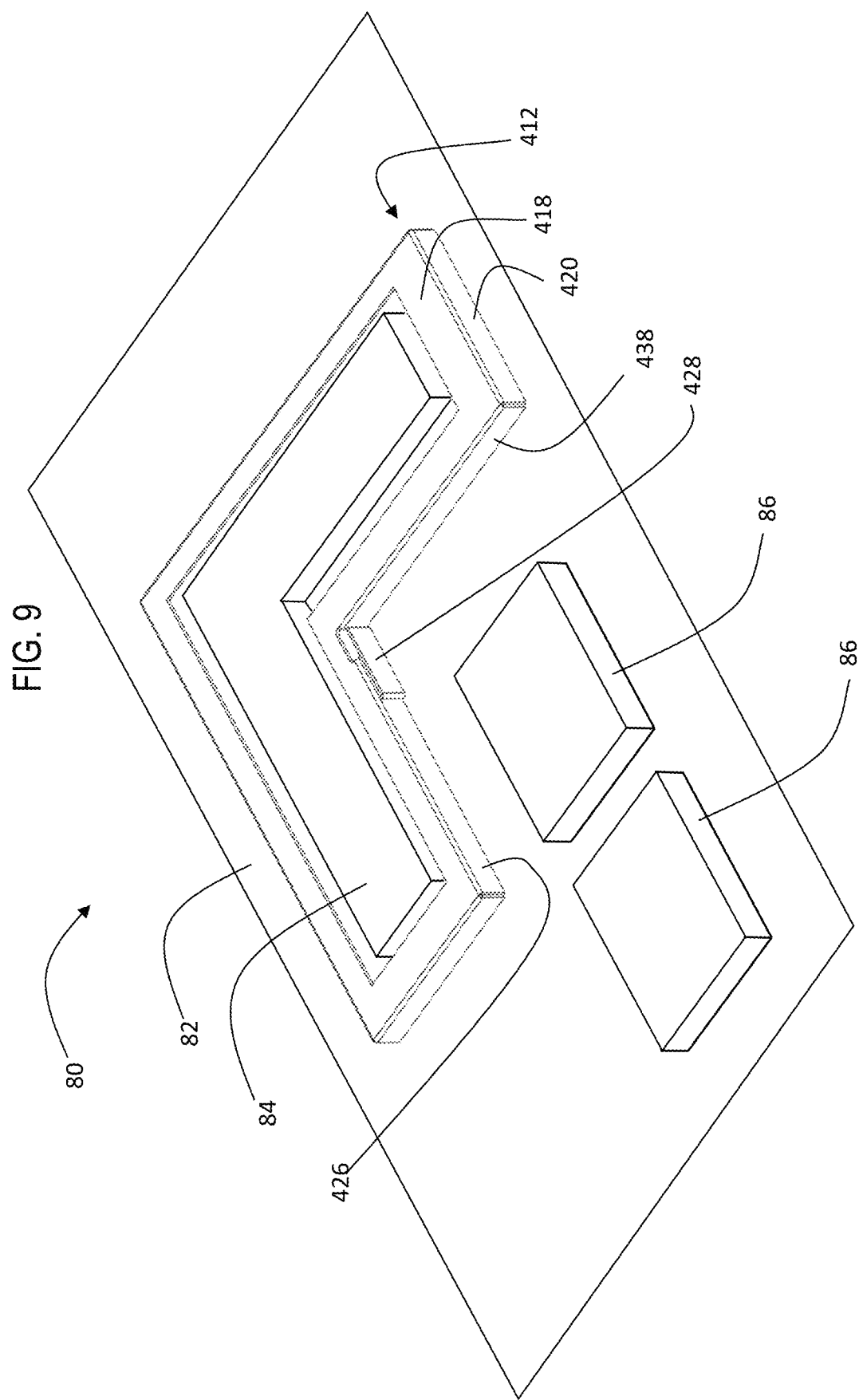

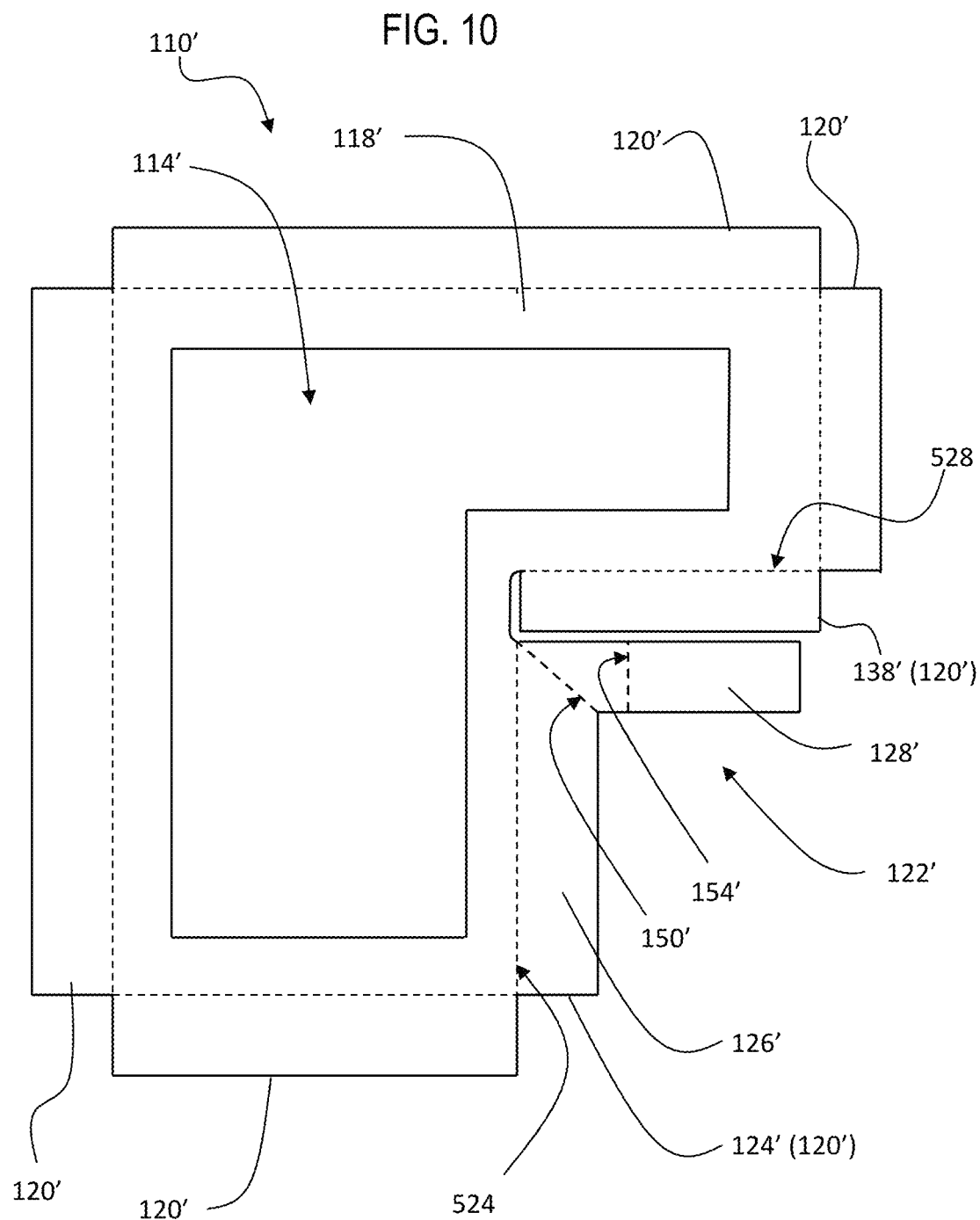

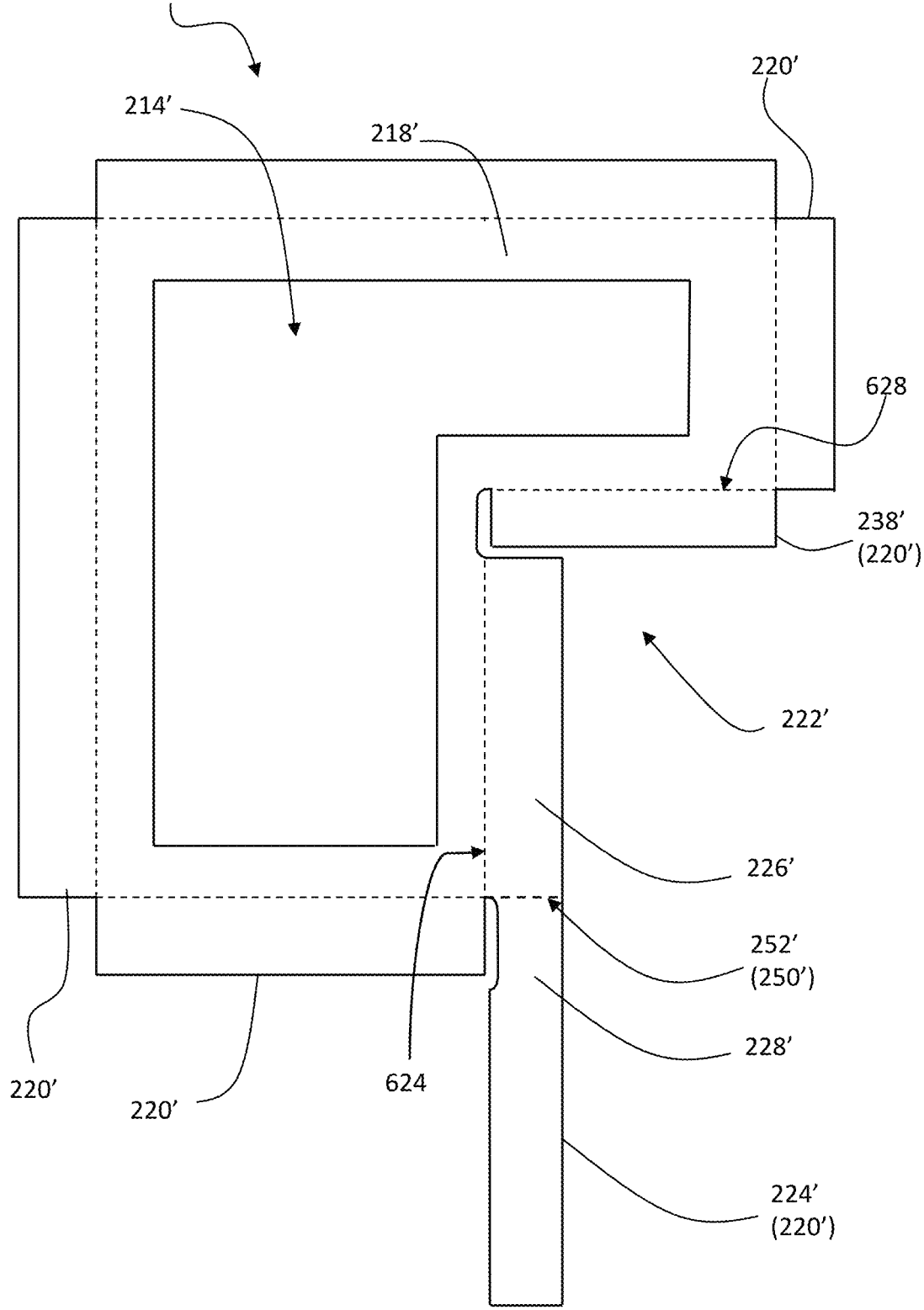

ELECTROMAGNETIC INTERFERENCE SHIELD

INTRODUCTION

Many electronic devices include circuit boards, which may further include various electronic components such as integrated circuits, microcontrollers, resistors, potentiometers, transistors, capacitors, inductors, transformers, diodes, silicon-controlled rectifier, crystal oscillators, switches and relays, sensors, transmitters, receivers, and/or transceivers. As electronic devices become more complex, and include more components, there is often an increase in electromagnetic interference (EMI). While the source of EMI can vary, an increase in EMI emitted from the external environment or individual components included in an electronic device can result in a decrease in sensitivity of wireless receivers, for example Radio Frequency (RF) receivers, known as desense.

EMI shields can be utilized to reduce or block EMI. EMI shields can take different forms and vary from large, shielded enclosures provided around an outside cabinet or housing of an electronic system to relatively smaller EMI shields provided within system enclosures to cover individual electronic devices, circuit boards, or various electronic components typically found on the same.

BRIEF DESCRIPTION OF THE DRAWINGS

The present disclosure can be understood from the following detailed description, either alone or together with the accompanying drawings. The drawings and related description of the figures are included to provide a further understanding of the present disclosure and are incorporated in and constitute a part of this specification. The drawings illustrate one or more nonlimiting aspects and implementations of the present teachings and together with the description explain certain principles and operation. In the drawings:

FIG. 5 is an enlarged partial bottom perspective view of region 4 in FIG. 3.

FIG. 6 an enlarged partial top view of another example implementation of an EMI shield comprising another example implementation of a frame.

FIG. 7 is a perspective view of another example implementation of an EMI shield including a frame and a cover, with the EMI shield in a first, disassembled, state.

FIG. 8 is a perspective view of the EMI shield of FIG. 7 in a second, assembled, state.

FIG. 9 is a perspective view of an electronic device comprising a printed circuit board (PCB) and the EMI shield of FIGS. 2 and 3 fixedly coupled to the PCB.

FIG. 10 is a top view of an example implementation of a cut blank for formation of the frame of the EMI shield of FIGS. 2-5 and 6.

FIG. 11 is a top view of another example implementation of a cut blank for formation of the frame of the EMI shield illustrated in FIG. 6.

DETAILED DESCRIPTION

Figure 1:
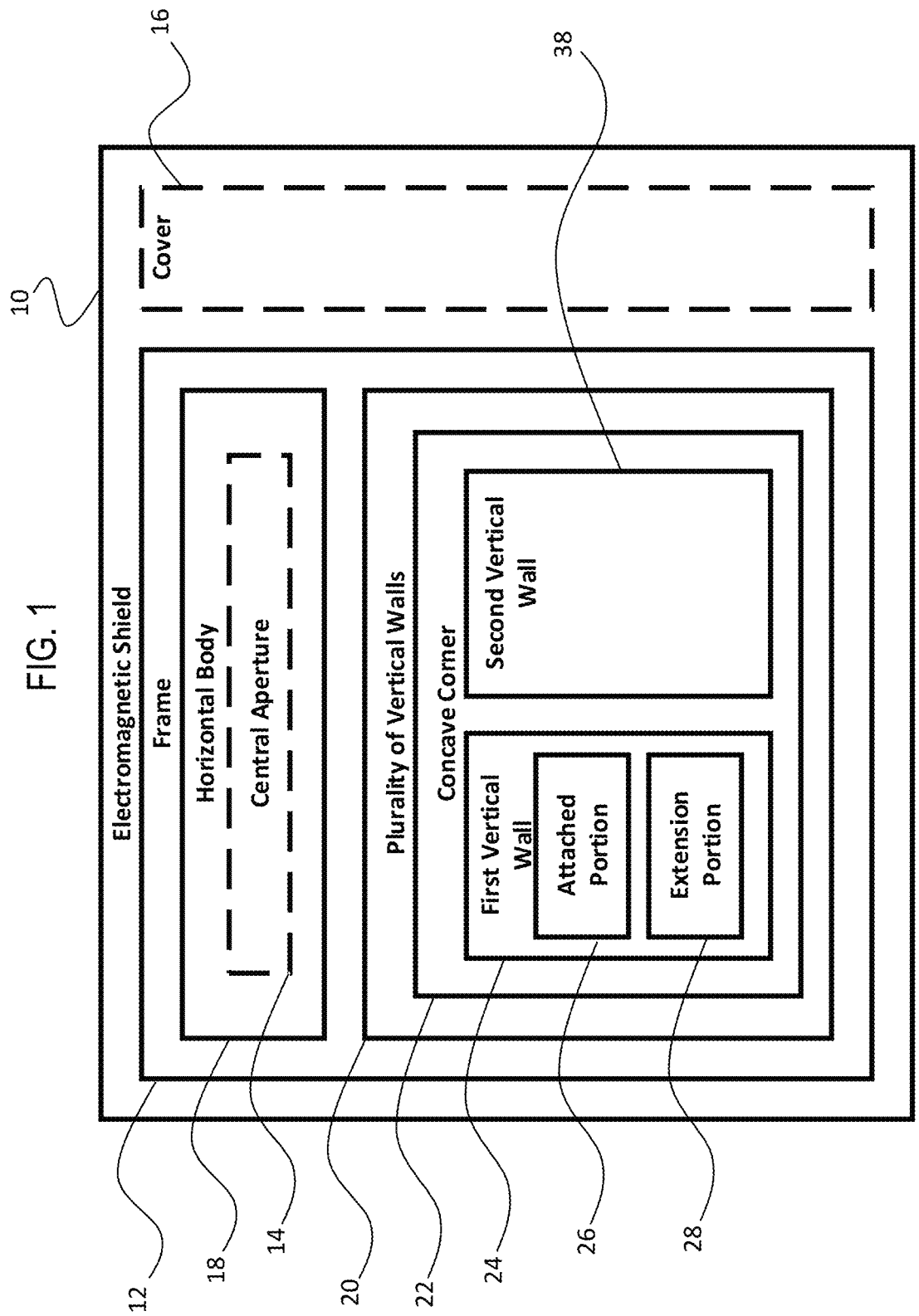
FIG. 1 is a block diagram illustrating an EMI shield.

As noted above, electromagnetic interference (EMI) can negatively affect the performance of some components of an electronic device. While a system chassis or external EMI shield may prevent EMI originating from outside of the electronic device, EMI can also be emitted within an electronic device. Stated differently, one component may negatively impact another component all in the same electronic device. If one component emits EMI, then other sensitive components may experience reduced performance which can impact performance of the entire electronic device. A decrease in sensitivity of components, for example a Radio Frequency (RF) receiver, resulting from EMI originating from or emitted internally by other components within an electronic device is generally referred to as desense. While EMI and desense can negatively affect several components, wireless communication components (e.g., transceivers) are particularly impacted. More specifically, a transceiver may be impaired or blocked from receiving weak signals which otherwise get lost in the EMI. To counter EMI, and resulting desense, different types of EMI shields have been developed. These EMI shields typically operate in a manner similar to a Faraday cage and reduce or block EMI. Accordingly, EMI shields can be disposed around a source of EMI or disposed around a sensitive component to act as a filter or shield. In particular, one approach to protecting components from EMI emitted by other components within the same electronic device is to dispose an EMI shield locally around the affected components, such as by mounting the EMI shield directly to the printed circuit board (PCB) which carries the components such that the EMI shield at least partially surrounds the affected components. For example, the board-mounted EMI shield may comprise vertical walls that extend perpendicularly from the PCB and laterally encircle the components and a horizontal cover parallel to the PCB that is coupled to the vertical walls and covers the components. Other examples of board-mounted EMI shields include a first variety comprising unibody EMI shields soldered directly onto a PCB and a second variety comprising a two-part configuration having a first part and a second part, wherein the first part is soldered onto a PCB and the second part is attached to the first part.

However, in some circumstances it can be challenging to form a board-mounted EMI shield that is efficient to manufacture and also adequately shields the electrical components. For example, while some relatively efficient manufacturing techniques can be used to form EMI shields, some limitations of these techniques can result in there being gaps in the shield which can allow some EMI to leak through. For example, die stamping is a very cost effective and efficient way to form EMI shields. Die stamping an EMI shield generally comprises cutting sheet metal to form a flat blank and folding portions of the blank to form the vertical walls mentioned above. But the process of die stamping can create openings (i.e., gaps) in the EMI shield, particularly around concave external corners. More specifically, when there is a concave corner, because the walls adjacent to that corner are cut from the same metal sheet, it is not possible for both of the walls to extend fully into the corner, i.e., a first wall of a concave corner is cut full length at the expense of a second wall of the concave corner, which ends short of the corner by at least a length equal to a height of the first wall. While the first and second wall will then define a virtual concave corner of the EMI shield, the second wall does not actually extend completely to the first wall and an opening is formed due to the nature of the manufacturing processes. Openings in an EMI shield provide gaps for EMI to pass through thereby reducing the effectiveness of the EMI shield and potentially reducing performance of an electronic device including the same. While other manufacturing techniques, such as die casting, machining from a solid block of material, or additive manufacturing, may avoid such openings or gaps these manufacturing processes are more expensive and complicated compared to die stamping, and thus these may not be viable alternatives to die stamping in some circumstances.

An alternate solution to avoid openings around concave corners in a board-mounted EMI shield is to ensure that none of the board-mounted EMI shields in the device have any concave corners. But this approach is not always possible, and when possible, may be inefficient. For example, in some circumstances the component(s) or regions that need to be shielded may be shaped such that an EMI shield with a concave corner is needed to adequately shield the components. For example, if the components or region to be shielded has an "L" shape, then an "L" shaped EMI shield may be needed. While a larger square or rectangular shaped EMI shield without a concave corner could cover the "L" shaped components or region to be shielded, such an EMI shield will also cover other portions of the PCB and thus may cover neighboring components in addition to the components that were intended to be shielded. If these neighboring components emit EMI, the EMI shield will not block that EMI because the component is inside the shield, thus defeating the purpose of the EMI shield. While it may be possible, in some circumstances, to design the PCB to omit the neighboring components in the vicinity of the components to be shielded, thereby allowing a square or rectangular shaped EMI shield to be used to cover the components to be shielded without also covering neighboring components, this constraint on PCB design can be costly, due to unoccupied and valuable real estate on the surface of a circuit board being wasted and a larger than necessary circuit board potentially being required. In addition, the larger EMI shield uses more materials to manufacture, further increasing costs.

Therefore, it is desirable to find a solution to the issues described above so that an EMI shield can include a concave corner without openings which permit the passage of EMI while also being manufacturable by cost-effective manufacturing techniques. To address these and other issues, examples disclosed herein provide EMI shields that can be manufactured through cutting and folding (e.g., die stamping), but which nevertheless avoid (or significantly reduce) openings or gaps at concave corners, and which therefore protect against EMI and desense in a cost-effective manner. Further, in example EMI shields disclosed herein, a concave corner may comprise two vertical walls and a first one of these vertical walls includes an additional extension portion connected to the first vertical wall via a fold, with the additional extension portion extending beyond a first end of the first vertical wall towards the second one of the vertical walls. Because the additional extension portion extends beyond the end of the first vertical wall, an opening formed between the first end of the first vertical wall and the second vertical wall during manufacture, and which would otherwise allow EMI to pass through, is at least partially or totally covered by the extension portion. As noted above, the opening between the first wall and the second wall occurs due to limitations associated with stamping, however, in the examples disclosed herein this opening is covered up (fully or partially) and thus the detrimental impact associated with the same can be avoided. Stated differently, the examples disclosed herein include a concave corner and still reduce or block EMI that would otherwise pass through an opening formed at the concave corner during manufacture by stamping. Thus, the EMI shield disclosed herein can be manufactured simply and with reduced cost while also avoiding the desense due to leakage of EMI through a concave corner.

In some examples, the additional extension portion is connected to the first end of the first vertical wall, which is the end closest to the second wall. In other examples the additional extension portion is connected to a second end of the first vertical wall, which is opposite from the first end. Further still, in some examples the additional extension portion may be connected to the first vertical wall by a single fold, while in other examples the additional extension portion may be connected to the first vertical wall by a plurality of folds. Thus, the configuration of the additional extension portion (e.g., size, number of folds, connection point to the first wall) can vary from one example to the next. Moreover, in various examples, the extension portion can be formed through the same relatively inexpensive manufacturing techniques used to form the remainder of the EMI shield, such as stamping (i.e., cutting and bending). In particular, in various examples the extension portion may be formed from the same sheet of metal as the vertical walls and may be shaped into its ultimate configuration through one or more bending operations that form the one or more folds connecting the extension portion to the first wall. Thus, in examples disclosed herein, the extension portion is integrally coupled to the first wall (i.e., formed as part of the same unitary body), and no additional operation of fastening the extension portion to the first wall (e.g., by welding, adhesive, fasteners, etc.) is needed. In contrast, an alternative approach of fastening a separate patch to the shield over the opening (e.g., by welding or other fastening techniques) may require usage of fastening machinery separate from the stamping machinery used to form the remainder of the EMI shield, and/or may require additional human or robot actions, and thus such alternative approaches would be much more complicated and more costly than examples disclosed herein which can rely on relatively simple and cost effective stamping techniques. Thus, examples disclosed herein can reduce EMI leakage through concave corners while still being cost effective to produce. As noted above, EMI shields may come in two varieties including a first variety comprising a unibody and a second variety comprising a two-part configuration. The examples described herein are applicable to both varieties. The figures show the two-part configuration as an example, but the same principles can be applied to a unibody design.

Additionally, "corner" is used herein to refer generally to the region where two adjacent vertical walls intersect or, in cases in which one wall ends short of meeting the other (such as at concave corners), the region where the two adjacent walls would have intersected if they were extended. In other words, "corner" is intended to include virtual corners where the two adjacent vertical walls do not physically intersect but a plane defined by one of the two vertical walls intersects with the other of the two vertical walls or with a plane defined by the other of the two vertical walls to form the corner.

Turning now to the figures, various devices, systems, and methods in accordance with nonlimiting aspects of the present disclosure will be described. In the following description, directional/relational terms such as horizontal, vertical, bottom, top, front, back, above, below, up, and down and the like are used to aid understanding, but these terms are used only in relation to the orientations and arrangements depicted in the figures and are not intended to imply anything about the locations or orientations of the parts in other contexts, such as relative to an external reference frame. Thus, for example, an EMI shield that is illustrated in the figures and described herein as having a horizontal body and a plurality of vertical walls may be positioned in a manner that is rotated 90 degrees from the illustrated orientation. In particular, the directional term "vertical" may be used herein relative to the horizontal body to refer to directions that will be perpendicular to the horizontal body of the EMI shield. The term "vertical" may also be used herein relative to a system that is to receive the EMI shield, and in this context refers to directions that would be perpendicular to the face of the PCB in a state of the PCB being in an installed position in the system. By extension, "horizontal" is used herein to refer to any direction perpendicular to a vertical direction, or in other words any direction parallel to the horizontal body of the EMI shield (or parallel to the PCB in a state of the EMI shield installed on the PCB). References herein to vertical and horizontal do not imply anything regarding the orientations of components relative to other objects or reference frames, and thus, for example, a direction described as "vertical" herein could be horizontal relative to some other reference frame, such as the ground.

FIG. 1 is a block diagram conceptually illustrating an EMI shield 10. It should be understood that FIG. 1 is not intended to illustrate specific shapes, dimensions, or other structural details accurately or to scale, and that implementations of the EMI shield 10 may have different arrangements of the illustrated components and may also include other parts that are not illustrated.

As shown in FIG. 1, the EMI shield 10 comprises a frame 12 that includes a horizontal body 18 and a plurality of vertical walls 20 which, in part, define a concave corner 22. The vertical walls 20 extend perpendicularly from the horizontal body 18 and define a lateral perimeter of the frame 12. The frame 12 is configured to be coupled to a PCB of an electronic device when the EMI shield 10 is installed therein, with the vertical walls 20 extending perpendicularly from the PCB and laterally encircling one or more components of the electronic device.

In some examples, the horizontal body 18 optionally comprises (i.e., defines) a central aperture 14. The central aperture 14 may allow for the components shielded by the EMI shield 10 to be accessed when the frame 12 is coupled to the PCB without requiring that the frame 12 be removed from the PCB. In some examples, the EMI shield 10 also optionally comprises a cover 16, which is configured to be removably coupled to the frame 12 so as to cover the central aperture 14 and/or other openings in the frame 12 to reduce EMI leakage therethrough. In implementations that comprise the aperture 14 and cover 16, the frame 12 may be securely attached to the PCB (e.g., via soldering) and the shield 10 may surround the components on all of their exposed sides (i.e., each side other than their bottom, which is coupled to the PCB), which can improve the shielding effectiveness and structural integrity of the shield 10, while still allowing the components shielded by the EMI shield 10 to be accessible when needed, e.g., for servicing or replacement. For example, the cover 16 can be removed and the components accessed through the central aperture 14. In other examples, the cover 16 and/or central aperture 14 are omitted from the frame 12.

The plurality of vertical walls 20 includes at least a first vertical wall 24 and a second vertical wall 38. The first and second vertical walls 24 and 38 are approximately perpendicular to each other and, in part, define the concave corner 22. The first vertical wall 24 comprises at least an attached portion 26 and an extension portion 28. The attached portion 26 is attached directly to the horizontal body 18 via a fold, whereas the extension portion 28 is not directly connected to the horizontal body 18. Instead, the extension portion 28 is connected directly to and extends from the attached portion 26 via one or more folds.

The attached portion 26 has a first end proximate to, but spaced from, the second vertical wall 38 and a second end opposite the first end. That is, there is an opening or gap between the first end of the attached portion 26 and the second vertical wall 38. This opening occurs as a result of the attached portion 26 and the second vertical wall 38 being part of a concave corner and having been formed by cutting and bending, as described above. More specifically, the opening corresponds to a region previously occupied by the second vertical wall 38 while in the flat blank shape after cutting and before the second vertical wall 38 was bent into a final position. The extension portion 28 extends beyond the first end of the attached portion 26 and at least partially covers the opening, and thus reduces or blocks EMI from passing therethrough. In some examples, the extension portion 28 extends fully across the opening and contacts the second vertical wall 38. In other examples, the extension portion 28 extends partially across the opening to a position near, but not touching, the second vertical wall 38.

In some examples, the extension portion 28 is coupled to the first end of the attached portion 26, i.e., the end closest to the concave corner and the opening. In these examples, the extension portion 28 is coupled to the first end of the attached portion 26 via two or more folds. One such example is described below in greater detail with reference to FIGS. 2-5. In other examples, the extension portion 28 is coupled to the second end of the attached portion 26, opposite from the first end. In some of these examples, the extension portion 28 is coupled to the second end of the attached portion 26 via one or more folds. One such example is described below in greater detail with reference to FIG. 6.

In some examples, the extension portion 28 is integrally connected to (i.e., part of the same unitary body as) the attached portion 26. More specifically, in some examples, the entire frame is a unitary body. For example, in some implementations the frame 12, including the extension portion 28 and the attached portion 26, are formed from the same unitary piece of sheet metal by cutting and bending (e.g., stamping). For example, the sheet metal may be cut into a flat blank shape comprising a central portion (which will become horizontal body 18) and tabs (which will become the vertical walls extending horizontally from the central portion. The tabs are then bent relative to the central portion to form the vertical walls 20. In the flat blank state, the extension portion 28 may be coplanar with the attached portion 26 and extend horizontally therefrom. Subsequently, the extension portion 28 may be bent one or more times relative to the attached portion 26 to cause the extension portion 28 to abut and at least partially overlay (overlap) the attached portion 26 and to cause a free end of the extension portion 28 to extend beyond the first end of the attached portion 26. Thus, the extension portion 28 can be formed through the same relatively inexpensive manufacturing techniques used to form the remainder of the EMI shield 10, namely cutting and bending.

For convenience, the illustrations of FIG. 1 shows one concave corner 22. However, it should be understood that the perimeter of the EMI shield 10 could include a plurality of concave corners (not shown), as well as convex corners (not shown). In these examples, where the perimeter of the EMI shield 10 includes the plurality of concave corners, the features and principals described herein pertaining to the concave corner 22 are the same with respect to each of the plurality of concave corners.

The EMI shield 10 may comprise sheet metal or metal screen. The sheet metal or metal screen may comprise metal, including, but not limited to copper, brass, nickel, silver, steel, tin, aluminum, and alloys including the same. In some implementations, the sheet metal or metal screen has a thickness from about 0.2 millimeters to about 0.5 millimeters.

Turning now to FIGS. 2-5, an example EMI shield 110 is described. The EMI shield 110 comprises at least a frame 112. The frame 112 is one example configuration of the frame 12 described above, and thus some components of the frame 112 are similar to (e.g., specific configurations of) components of the frame 12 described above. Similar components are referred to using the same last two digits, such as 26 and 126. The descriptions of components of the frame 12 are applicable to the similar components of the frame 112, and thus duplicative description of various aspects already described above may be omitted below. Although the frame 112 is one configuration of the frame 12, the frame 12 and the components thereof are not limited to the frame 112 and the components thereof. In some examples, the EMI shield 110 may further comprise a cover (not illustrated), which covers the frame 112 as described above in relation to EMI shield 10. FIG. 7, described below, illustrates one example of a cover 316 that may be used as the cover of the EMI shield 110, but the cover of EMI shield 110 is not limited to the cover 316. In some examples, the EMI shield 110 does not comprise any cover.

As explained above, an EMI shield 110 may comprise a frame 112, and in some examples (optionally) a cover (not illustrated). The frame 112 is configured to be disposed around the one or more electronic components (such as the electronic components 184 shown in FIG. 10) of an electronic device (such as the electronic device 180 shown in FIG. 10). For example, the frame 112 may be configured to be fixedly coupled to a PCB of the electronic device (e.g., the PCB 82 shown in FIG. 10).

Figure 2:
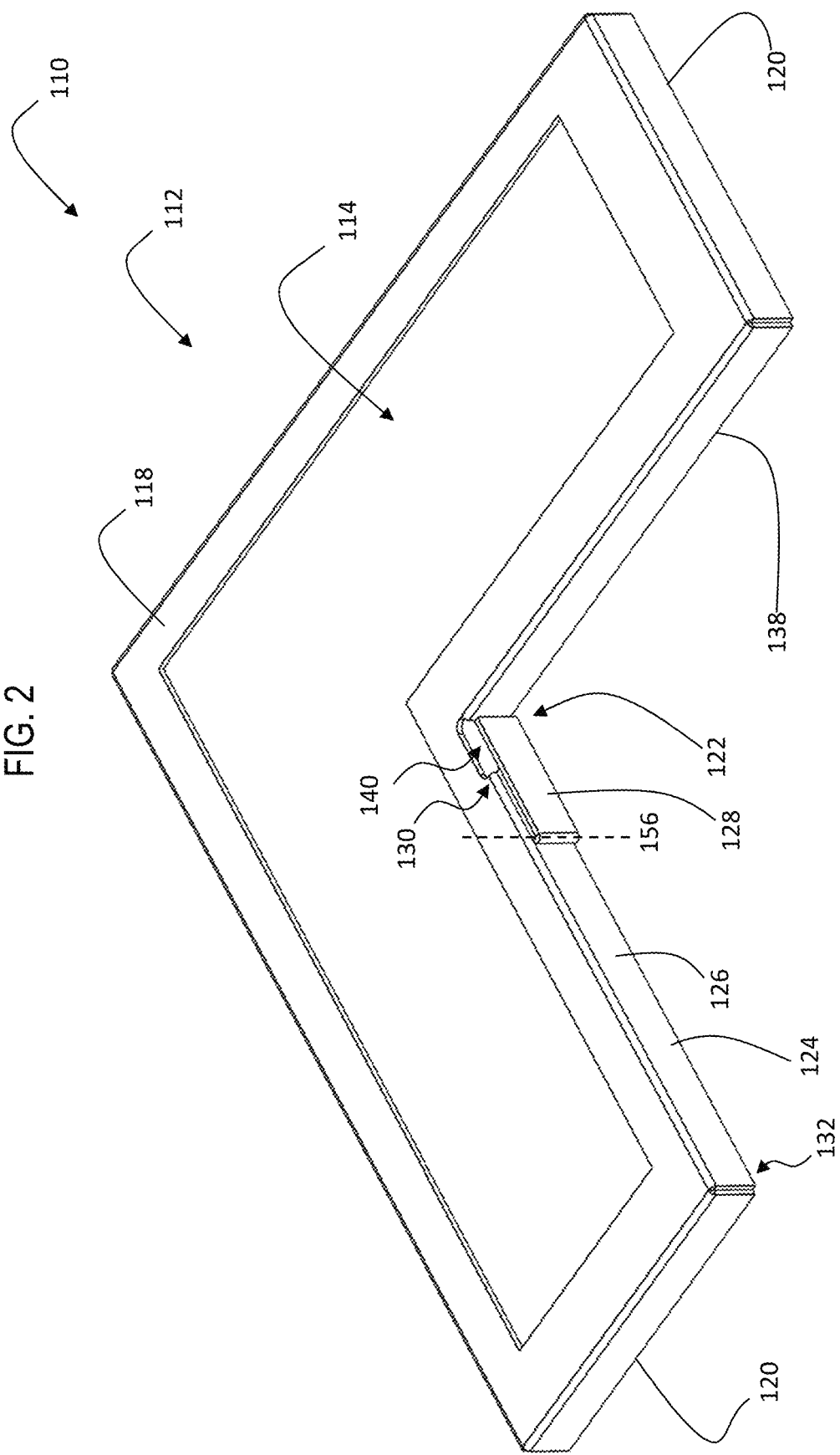
FIG. 2 is a top view of an example implementation of an EMI shield comprising an example implementation of a frame.
Figure 3:
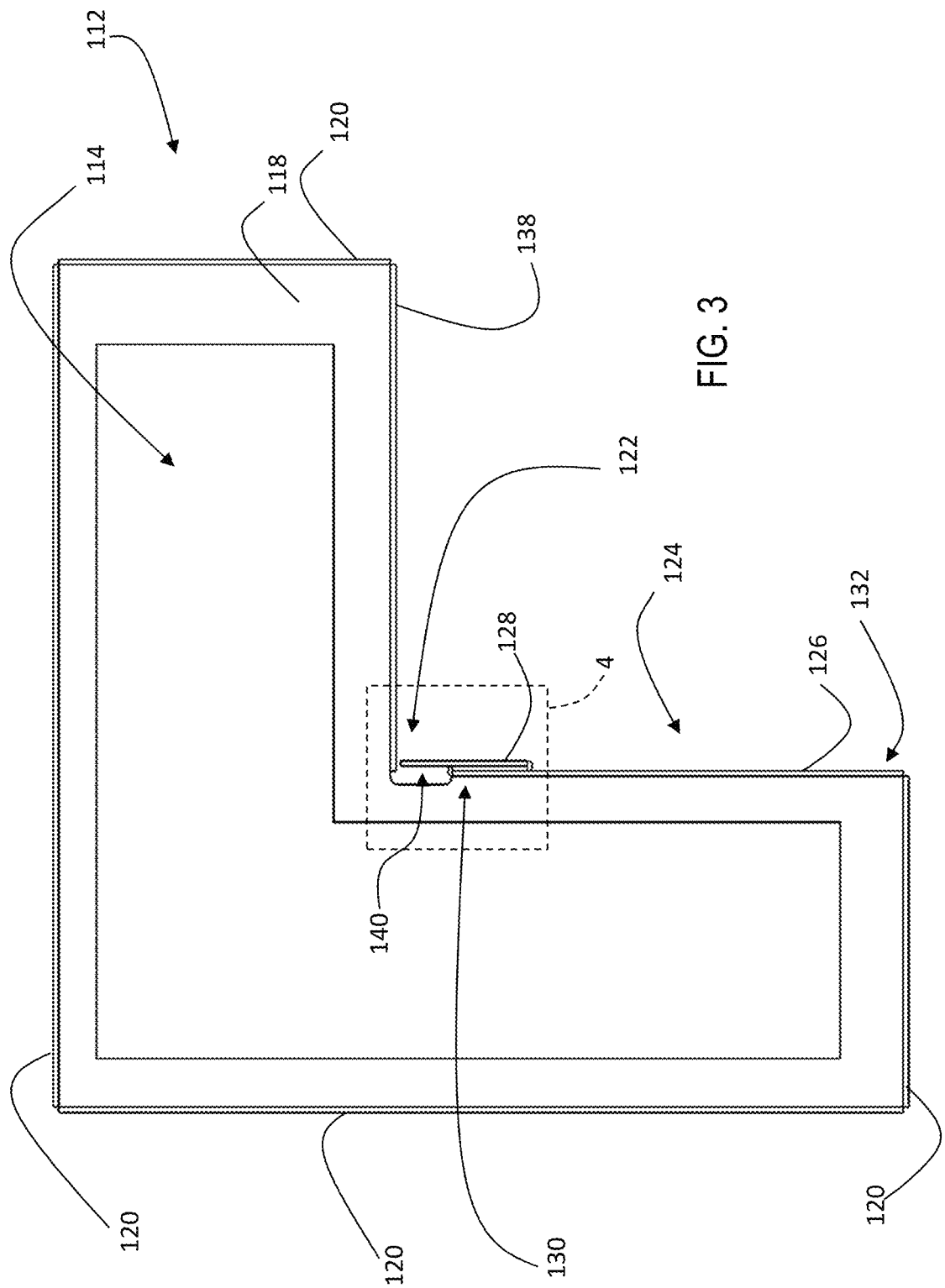
FIG. 3 is a top perspective view of the EMI shield comprising the frame of FIG. 2.

As shown in FIGS. 2 and 3, the EMI shield 110 comprises a frame 112 that includes a horizontal body 118 and a plurality of vertical walls 120 which, in part, define a concave corner 122. The plurality of vertical walls 120 includes at least a first vertical wall 124 and a second vertical wall 138, and the first vertical wall 124 comprises at least an attached portion 126 and an extension portion 128.

In the example illustrated in FIGS. 2-5, the horizontal body 118 of the frame 112 defines a central aperture 114. In other examples, the central aperture 114 is omitted. In some examples in which the central aperture 114 is provided, a cover (not illustrated) may be removably coupled to the frame 112 to cover the central aperture 114 to reduce EMI leakage therethrough.

The plurality of vertical walls 120, in part, define a lateral perimeter of the EMI shield 110 along with the horizontal body 118. Notably, the perimeter includes at least one concave corner 122, or as described above a virtual concave corner. Additionally, the concave corner 122 faces away from the horizontal body 118. The plurality of vertical walls 120 includes at least one pair of vertical walls comprising a first vertical wall 124 and a second vertical wall 138 that are approximately perpendicular to each other and, in part, define the concave corner 122. As previously described, the concave corner 122 may comprise a virtual concave corner with respect to the attached portion 126 and the second vertical wall 138 as neither physically intersect with the other. In implementations where the concave corner 122 comprises a virtual concave corner, the concave corner is defined by the approximately perpendicular intersection of a first plane (not shown) defined by the attached portion 126 with a second plane (not shown) defined by the second vertical wall 138.

The first vertical wall 124 comprises an attached portion 126 connected directly to the horizontal body 118 and an extension portion 128 connected to the attached portion 126 by a first fold 150 defining a first axis 152. The attached portion 126 has a first end 130 proximate to, but spaced from, the second vertical wall 138 and a second end 132 opposite the first end 130 and spaced father from the second vertical wall 138 than the first end 130 of the attached portion 126. The first end 130 of the attached portion 126 and the second vertical wall 138, in part, define an opening 140 therebetween. Stated differently, the opening 140 is adjacent the concave corner 122 and located between the first end 130 of the attached portion 126 and the second vertical wall 138. This opening 140 comprises a vertically oriented portion 141 that is best seen in FIG. 5, where it is indicated by dashed lines. The vertically oriented portion 141 of the opening 140 corresponds to the region where the first vertical wall 126 would be located if it extended all the way to the second vertical wall 138 instead of ending short. This vertically oriented portion 141 is difficult to see in some of the figures because it is partially covered by the extension portion 128, as explained in greater detail below. The opening 140 may also comprise a horizontally oriented portion extending into the horizontal body 118. As alluded to above, the opening 140 is a product of the stamping process in which the frame 112 is manufactured. More specifically, the opening 140 corresponds to a region previously occupied by the second vertical wall 138 of the frame 112 before the second vertical wall 138 was bent into a final position.

Figure 4:
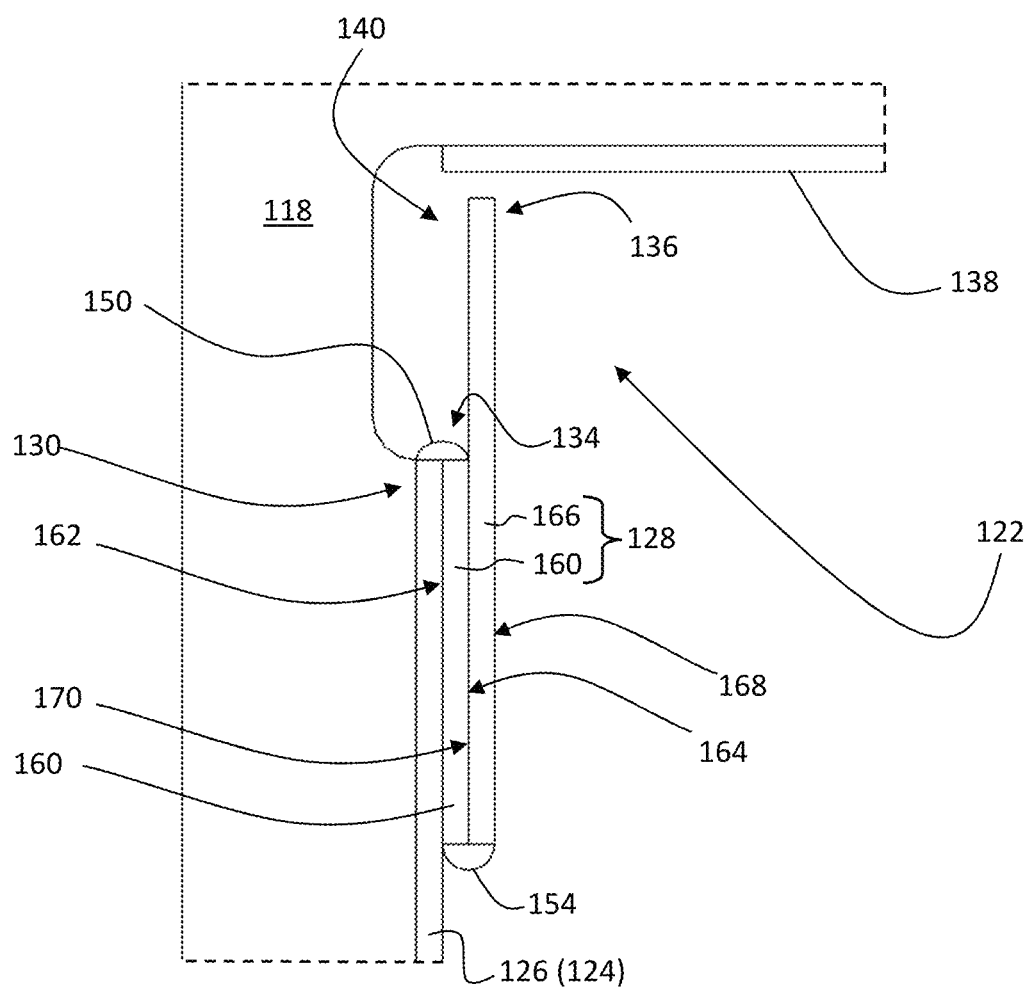
FIG. 4 is an enlarged partial top view of the region 4 in FIG. 3, which comprises a concave corner portion of the frame of the EMI shield illustrated in FIGS. 2 and 3.

As shown in FIGS. 4 and 5, the extension portion 128 of the first vertical wall 124 has an attached end 134 connected by the first fold 150 to the attached portion 126 as well as a free end 136 spaced from and opposite the attached end 134.

With reference to the opening 140, the extension portion 128 of the first vertical wall 124 reduces or blocks EMI from passing therethrough. As shown in FIGS. 2-5, the extension portion 128 of the first vertical wall 124 at least partially overlays, abuts, and extends past the attached portion 126 to at least partially cover the opening 140 (specifically, to at least partially cover the vertically oriented portion 141 of the opening 140) such that the free end 136 of the extension portion 128 is closer to the second wall than the attached portion 126. In another example, the free end 136 of the extension portion 128 is adjacent to or abuts the second vertical wall 138 and substantially covers the entire vertically oriented portion 141 of the opening 140 thereby reducing or blocking the passage of EMI. In other examples, the free end 136 of the extension portion 128 may be spaced less than or equal to about 0.2 millimeters from the second vertical wall 138. In another example, the free end 136 of the extension portion 128 may be spaced less than or equal to about 0.15 millimeters from the second vertical wall 138. In still another example, the free end 136 is soldered onto the PCB and reference to the free end 136 as "free" corresponds generally to the state of free end 136 prior to being soldered. It is contemplated that the distance between the free end 136 of the extension portion 128 and the second vertical wall 138 could be configured to reduce or block specific EMI signals while allowing for other EMI signals that have minimal impact the one or more electronic components. In some examples, the EMI shield 110 is configured to reduce or block transmission of EMI signals from about a 2 GHz band to about a 7.1 GHz band and reduces degradation to levels less than 1 dB. In one example, the EMI shield 110 is configured to reduce or block transmission of EMI signals from about a 4.9 GHz Wireless Fidelity (WiFi) band to about a 7.1 GHz WiFi band. In another example, the EMI shield 110 is configured to reduce or block transmission of EMI signals from about a 2.4 GHz industrial, scientific, and medical (ISM) band.

The illustration of FIGS. 4 and 5 provide enlarged views of the concave corner 122 of the EMI shield 110 of FIGS. 2 and 3. In some example implementations the extension portion 128 of the first vertical wall 124 comprises a first portion 160 extending from the first fold 150 to a second fold 154 defining a second axis 156 and a second portion 166 extending from the second fold 154 to the free end 136 of the extension portion 128. In this example, both the first portion 160 and second portion 166 of the extension portion 128 at least partially overlay the attached portion 126 and the second portion 166 at least partially overlays the first portion 160 as illustrated in FIGS. 4 and 5. As shown in FIG. 4, the first portion 160 of the extension portion 128 comprises a top face 162 and a bottom face 164 spaced from and opposite the top face 162. Additionally, the second portion 166 of the extension portion 128 comprises a top face 168 and a bottom face 170 spaced from and opposite the top face 168. In some examples, the top face 162 of the first portion 160 abuts the attachment portion and the bottom face 164 of the first portion 160 abuts the bottom face 170 of the second portion 166. In other examples, the bottom face 164 of the first portion 160 may be positioned to abut the attached portion 126 in a manner opposite of the illustrations in FIGS. 4 and 5 such that the top face 162 of the first portion 160 abuts the top face 168 of the second portion 166 (not illustrated). Stated differently, the extension portion 128 of the first vertical wall 124 can be positioned on an inside or an outside of the attached portion 126, relative to the one or more electronic components. The first fold 150 and second fold 154 enable the first portion 160 and the second portion 166 of the extension portion 128 of the first vertical wall 124 to fold back on to one another as well as the attached portion 126 of the first vertical wall 124. It is contemplated that additional examples including more than two folds could also be utilized (not shown).

In some example implementations having the first fold 150 and second fold 154, the first axis 152 and second axis 156 are disposed at different angles relative to each other. In some examples, the first fold 150 and the first axis 152 are disposed at either a 45° or 135° angle relative to a longitudinal axis of the extension portion 128 of the first vertical wall 124. Additionally, the second fold 154 and the second axis 156 are disposed at a 90° angle relative to a longitudinal axis of the extension portion 128 of the first vertical wall 124. In other examples, which may include more than two folds (not shown), it is contemplated that other angles could be utilized to ensure the extension portion 128 extends past the attached portion 126 and is positioned closer to the second vertical wall 138 than the attached portion 126.

With reference to FIGS. 4 and 5, a gap between the extension portion 128 of the first vertical wall 124 and the second vertical wall 138 is illustrated for convenience, but it should be understood that the extension portion 128 of the first vertical wall 124 can physically contact and abut the second vertical wall 138.

For convenience, the illustrations of FIGS. 2 and 3 include one concave corner 122. However, it should be understood that the perimeter of the EMI shield 110 could include a plurality of concave corners (not shown). For example, the perimeter of the EMI shield 110 could include two concave corners (not shown). In another example, the EMI shield 110 could include three concave corners (not shown). In yet another example, the EMI shield 110 could include four or more concave corners (not shown) wherein the EMI shield 110 generally defines a lower case "t" or plus sign "+" shape, although the EMI shield 110 is not limited to those specific shapes. In these examples, the plurality of vertical walls 120 includes a plurality of pairs of vertical walls wherein each pair of vertical walls includes a first vertical wall 124 as described above and a second vertical wall 138 as described above. Further, each of the pairs of vertical walls of the plurality of vertical walls 120, in part, defines a different concave corner of the plurality of concave corners along the perimeter of the EMI shield 110. In these examples, where the perimeter of the EMI shield 110 includes the plurality of concave corners, the features and principals described herein pertaining to the concave corner 122 illustrated in FIG. 2 are the same with respect to each of the plurality of concave corners.

Turning now to FIG. 6, another example implementation of an EMI shield 210 is provided. The EMI shield comprises at least a frame 212. The frame 212 is one example configuration of the frame 12 described above, and thus some components of the frame 212 are similar to (e.g., specific configurations of) components of the frame 12 described above. Similar components are referred to using the same last two digits, such as 26 and 226. The descriptions of components of the frame 12 are applicable to the similar components of the frame 212, and thus duplicative description of various aspects already described above may be omitted below. Although the frame 212 is one configuration of the frame 12, the frame 12 and the components thereof are not limited to the frame 212 and the components thereof. In some examples, the EMI shield 210 may further comprise a cover (not illustrated), which covers the frame 212 as described above in relation to EMI shield 10. FIG. 7, described below, illustrates one example of a cover 316 that may be used as the cover of the EMI shield 210, but the cover of EMI shield 210 is not limited to the cover 316. In some examples, the EMI shield 210 does not comprise any cover.

The frame 212 includes a horizontal body 218, which may be similar to the horizontal bodies 18 and 118 described above. The frame 212 also includes a plurality of vertical walls 220 which, in part, define a lateral perimeter of the frame 212 along with the horizontal body 218. Notably, the perimeter includes at least one concave corner 222, or as described above a virtual concave corner. Additionally, the concave corner 222 faces away from the horizontal body 218. The plurality of vertical walls 220 includes at least one pair of vertical walls comprising a first vertical wall 224 and a second vertical wall 238 that are approximately perpendicular to each other and, in part, define the concave corner 222. The first vertical wall 224 comprises an attached portion 226 connected directly to the horizontal body 218 and an extension portion 228 connected to the attached portion 226 by a first fold 250 defining a first axis 252. The attached portion 226 has a first end 230 proximate to, but spaced from, the second vertical wall 238 and a second end 232 opposite the first end 230 and spaced father from the second wall than the first end 230 of the attached portion 226. The first end 230 of the attached portion 226 and the second vertical wall 238, in part, define an opening 240 therebetween.

Like the extension portion 118 described above, the extension portion 228 of the first vertical wall 224 has an attached end 234 connected by a first fold 250 to the attached portion 226 as well as a free end 236 spaced from and opposite the attached end 234, and the extension portion 228 extends across and at least partially covers the opening 240. The free end 236 may be spaced apart from or abut the second wall 238, similar to the extension portion 118.

However, unlike the extension portion 118 described above which was attached to the first end of the attached portion, the extension portion 228 of the first vertical wall 224 is connected to the second end 232 of attached portion 226 of the first vertical wall 224, as shown in FIG. 6. In this example, the extension portion 228 is longer than the attached portion 226 and is folded a single time along the first fold 250 so that the extension portion 228 at least partially overlays, abuts, and extends past the attached portion 226. In other words, unlike the extension portion 118 described above which had multiple portions folded back over one another via a second fold, in some examples the extension portion 228 may comprise a single substantially straight (planar) portion without any additional folds besides the first fold 250. Furthermore, unlike the extension portion 118 described above which only partially overlays the attached portion, in some examples the extension portion 228 may overlay substantially all of the attached portion 226. For convenience, the illustration of FIG. 6 depicts the extension portion 228 as being positioned further from the central aperture 214 than the attached portion 226. However, in other examples the extension portion 228 is folded in an opposite manner such that the extension portion 228 is positioned closer to the central aperture 214 than the attached portion 226 (not shown). The EMI shield 210 of FIG. 6 includes the first fold 250, and associated first axis 252, disposed at a 90° angle relative to the longitudinal axis of the extension portion 228. Further, in this example, the extension portion 228 is not subdivided into different portions or subject to any additional folds other than the first fold 250.

With reference to FIG. 6, a gap between the extension portion 228 of the first vertical wall 224 and the second vertical wall 238 is illustrated for convenience, it should be understood that the extension portion 228 of the first vertical wall 224 can physically contact and abut the second vertical wall 238.

As previously described, the concave corner 222 may comprise a virtual concave corner with respect to the attached portion 226 and the second vertical wall 238 as neither physically intersect with the other. In this example, the concave corner 222 is defined by the approximately perpendicular intersection of a first plane (not shown) defined by the attached portion 226 with a second plane (not shown) defined by the second vertical wall 238.

For convenience, the illustration of FIG. 6 includes one concave corner 222. However, it should be understood that the perimeter of the EMI shield 210 could include a plurality of concave corners. For example, the perimeter of the EMI shield 210 could include two concave corners (not shown). In another example, the EMI shield 210 could include three concave corners (not shown). In yet another example, the EMI shield 210 could include four or more concave corners (not shown) wherein the EMI shield 210 generally defines a lower case "t" or plus sign "+" shape, although the EMI shield 210 is not limited to those specific shapes. In these examples, the plurality of vertical walls 220 includes a plurality of pairs of vertical walls wherein each pair of vertical walls includes a first vertical wall 224 as described above and a second vertical wall 238 as described above. Further, each of the pairs of vertical walls of the plurality of vertical walls 220, in part, defines a different concave corner of a plurality of concave corners of the perimeter of the EMI shield 210. In these examples, where the perimeter of the EMI shield 210 includes a plurality of concave corners, the features and principals described herein pertaining to the concave corner 222 illustrated in FIG. 6 are the same with respect to each of the plurality of concave corners.

Turning now to FIGS. 7 and 8, examples of an EMI shield and an electronic device comprising an EMI shield are described. For convenience, the illustrations of FIG. 7-9 utilize the example of the frame 112 depicted in FIGS. 2-5. However, it should be understood that in the EMI shield and the electronic device the example of the frame 212 depicted in FIG. 6 could be substituted in place of the frame 112 depicted in FIGS. 2-5.

FIG. 7 illustrates an exploded view of an example EMI shield 310. The EMI shield 310 comprises a frame. For example, in some implementations the EMI shield 310 may comprise the frame 112 of FIGS. 2-5, as shown in FIGS. 7 and 8. In other examples (not illustrated), the EMI shield comprises frame 212 in lieu of the frame 112. The EMI shield 310 further comprising a cover 316 that is configured to be removably coupled to the frame 112. The cover 316 is sized and shaped to be complementary to the frame 112. FIG. 8 illustrates the cover 316 removably coupled to the frame 112.

The cover 316 includes a horizontal portion 90 and a plurality of vertical portions 92 approximately perpendicular to the horizontal portion 90. Like the frame 112, the perimeter of the cover 316 includes at least one concave corner 94 (see FIG. 7), or as previously described above a virtual concave corner. Additionally, the concave corner 94 of the cover 316 faces away from the horizontal portion 90. The plurality of vertical portions 92 includes at least one pair of vertical portions comprising a first vertical portion 96 and a second vertical portion 98 that are approximately perpendicular to each other and, in part, define the concave corner 94 of the cover 316. In addition, a third vertical portion 97 may be provided that is parallel to the second vertical portion 98, with the second and third vertical portions 98 and 97 facing and partially covering the same vertical wall 124 of the frame 112. The third vertical portion 97 is configured to be disposed over, and in some cases abuts, the attached portion 126 of the vertical wall 124 (more specifically, the portion thereof which is not overlaid by the extension portion 98). The second vertical portion 98 is configured to be disposed over, and in some cases abut, the extension portion 128 of the frame 112 either partially or completely. In the illustrated example, the second vertical portion 98 is offset relative to the third vertical portion 97 because the extension portion 128 covered thereby is offset relative to the attached portion 126 covered by the third vertical portion 97. In other examples, the third vertical portion 97 is omitted and the second vertical portion 98 is extended fully along the length of the vertical wall 124. This may occur, for example, in some implementations in which the frame 212 is used instead of the frame 112, as in such implementations the extension portion 228 extends fully along the length of the vertical wall 124. This may also occur in some examples in which the frame 112 is used, and in some of these examples the third vertical portion 97 may thus be spaced slightly apart from the attachment portion 126 due to the offset of the extension portion 128. In other examples, the second vertical portion 98 is omitted and the third vertical portion 97 is extended fully into the concave corner 94. This may occur in examples in which the extension portion 128 or 218 is positioned on an interior side of the attached portion 126 or 226.

The second vertical portion 98 has a first end 100 proximate to, but spaced from, the first vertical portion 96 and a second end 102 opposite the first end 100 and spaced father from the first vertical portion 96 than the first end 100 of the second vertical portion 98. The first end 100 of the second vertical portion 98 and the first vertical portion 96, in part, define a cover opening 104 therebetween. Stated differently, the cover opening 104 is adjacent the concave corner 94 of the cover 316 and located between the first end 100 of the second vertical portion 98 and the first vertical portion 96. As previously alluded to above, the cover opening 104 is a product of the stamping process in which the cover 316 is manufactured. More specifically, the cover opening 104 corresponds to a region previously occupied by the first vertical portion 96 of the cover 316 before the first vertical portion 96 was bent into a final position. As previously described with reference to the concave corner 122 of the frame 112, the concave corner 94 of the cover 316 may comprise a virtual concave corner with respect to the first vertical portion 96 and the second vertical portion 98 as neither physically intersect with the other. In this example, concave corner 94 is defined by the approximately perpendicular intersection of a first plane (not shown) defined by the first vertical portion 96 with a second plane (not shown) defined by the second vertical portion 98.

For convenience, the illustrations of FIGS. 7 and 8 include the EMI shield 310 with only one concave corner 94. However, it should be understood that the perimeter of the EMI shield 310 could include a plurality of concave corners such that both the frame 112 and the cover 316 would also include a plurality of concave corners.

As illustrated in FIGS. 7 and 8, the opening 140 of the frame 112 and the cover opening 104 are not aligned or even positioned on the same side of the concave corner 122 of the EMI 310. This helps ensure that the each of the two openings 140, 104 referenced above are at least partially or totally covered so as to prevent the transmission of EMI. Stated differently, the opening 140 of the frame 112 is covered by the extension portion 128 as well as the first vertical portion 96 of the cover 316, whereas the cover opening 104 is blocked by the second vertical wall 138 of the frame 112 of the EMI shield 310. In some examples, the EMI shield 110 is configured to reduce or block transmission of EMI signals from about a 2 GHz band to about a 7.1 GHz band and reduces degradation to levels less than 1 dB. In one example, the EMI shield 110 is configured to reduce or block transmission of EMI signals from about a 4.9 GHz WiFi band to about a 7.1 GHz WiFi band. In another example, the EMI shield 110 is configured to reduce or block transmission of EMI signals from about a 2.4 GHz ISM band.

For convenience the illustrations of FIGS. 7 and 8 depict an example in which the frame 112 includes the extension portion 128 that is folded relative to the attached portion 126 to at least partially or totally cover the opening 140 formed during manufacture of the frame 112. However, it should be understood that the features and arrangements described in reference to the extension portions 128 and 229 of the frames 112 and 212 can provided in the cover 316 described above (not shown) in addition to or instead of these feature being provided in the frame 112. Stated differently, the cover 316 could comprise an extension portion at a concave corner 94, analogous to the extension portion 128 or 228, with this extension portion being coupled to the vertical wall 96 and extending across and at least partially covering the opening 104 a similar manner as described above in relation to the extension portion 128 or 218. In some examples in which the cover 316 comprises an extension portion, the frame 112 or 212 may lack an extension portion 128 or 228; in such examples, the opening 140 or 240 may not need to be covered by the extension portion 128 or 228 because it is adequately covered by the cover 316. In examples in which the frame 112 or 212 lacks the extension portion 128 or 228, the second vertical portion 98 may be omitted and the vertical wall 97 may be extended fully to the corner 94.

In some implementations, the frame 112 and the cover 316 are configured to blind mate with one another. Either one or both of the frame 112 and the cover 316 may include guide structures (e.g., ramps, rails, slots, flanges, or other guide structures) that guide the cover 316 onto the frame 112 into a desired position. Such guide structures are familiar to those of ordinary skill in the art, and thus are omitted from the illustrations to simplify the drawings.

The cover 316 may comprise sheet metal or metal screen. The cover 316 may be formed of a different material than the frame 112. The sheet metal or metal screen may comprise metal, including, but not limited to copper, brass, nickel, silver, steel, tin, aluminum and alloys including the same. The cover 316 may comprise a different metal than the frame 112. The sheet metal or metal screen of the cover 316 may comprise metal, including, but not limited to copper, brass, nickel, silver, steel, tin, aluminum, and alloys including the same. In some implementations, the sheet metal or metal screen has a thickness from about 0.1 millimeters to about 0.5 millimeters.

FIG. 9 illustrates an example electronic device 80 that comprises an EMI shield 410. In FIG. 9, the EMI shield 410 is illustrated merely for convenience as comprising the frame 412 that resembles the frame 112 of EMI shield 110, but the EMI shield 410 may be any one of the EMI shields disclosed herein, including EMI shields 10, 110, 210, and 310, and accordingly the frame 412 may be configured according to any of the frames described herein including frames 12, 112, and 212. In addition, a cover is not illustrated to avoid obscuring other aspects, but in some implementations the EMI shield 410 may comprise a cover, as described above in relation to each of the EMI shields 10, 110, 210, and 310.

As illustrated in FIG. 9, the frame 412 of the EMI shield 410 may be included in an electronic device 80. In this example, the frame 412 is fixedly coupled to a PCB 82 of the electronic device 80. In one example the frame 412 is soldered to the PCB 82. The frame 412 is also configured to surround the one or more electronic components 84 attached to the PCB 82. The one or more electronic component may be attached to the PCB 82 with any known method including, but not limited to, through-hole mounting (THM) or surface mount technology (SMT). The one or more electronic components 84 may comprise one or more components selected from the group of a resistor, potentiometer, transistor, capacitor, inductor, transformer, diode, silicon-controlled rectifier, integrated circuit, crystal oscillator, switch or relay, sensor, transmitter, receiver, and transceiver. In some examples, the one or more electronic components 84 comprises a transmitter, a receiver, or a transceiver. In other examples, the one or more electronic components 84 consists of a transceiver. Additionally, the PCB 82 may include a plurality of other electronic components 84 including resistors, potentiometers, transistors, capacitors, inductors, transformers, diodes, silicon-controlled rectifiers, integrated circuits, crystal oscillators, switches and relays, sensors, transmitters, receivers, and transceivers that are disposed on the PCB 82 but outside of the frame 412. The electronic device 80, as well as the PCB 82, may also include connectors that are configured to mate with complementary connectors of another electronic device, such as a larger system into which the electronic device 80 may be installed. For example, the electronic device 80 may be used as part a computing device (e.g., an input-output module (IOM) of a data storage system, a serve node, a blade of a blade server, or any other type of computing device), a network device (e.g., a switch, a router, or any other type of networking device), a power supply device, or any other type of electronic device. In some implementations, the electronic device 80 is configured to be installed within a system, which may include being received within a system chassis of the system. In some implementations, the electronic device 80 is configured to be removably installed within a system chassis of a larger system, for example, the electronic device 80 may be part of a pluggable module.

The frame 412 of the EMI shield 410 may comprise sheet metal or metal screen. The sheet metal or metal screen may comprise metal, including, but not limited to copper, brass, nickel, silver, steel, tin, and alloys including the same. The frame 412 may be formed stamping, casting, molding, forging, and/or machining.

In this example implementation, the cover 316 as described in reference to FIGS. 7 and 8 can also be included. The cover 316 of the EMI shield 410 is configured to be removably coupled to the frame 412 and to further surround the one or more electronic components 84. In some examples, the cover 316 is coupled to the frame 412 through a frictional connection Since the cover 316 is removable, maintenance and repair of the one or more electronic components 84 and/or the PCB 82 are generally simplified. If the one or more electronic components 84 surrounded by the frame 412 needs to be replaced, the cover 316 is removed, the one or more electronic components 84 is replaced with another electronic component, and the cover 316 is again removably coupled to the frame 412. No additional connection elements, e.g., pins, or adhesive agents, e.g., glues, are utilized to secure the cover 316 to the frame 412. Avoiding use of adhesive agents, EMI pastes, EMI foams, and the like reduces the risk of damaging the one or more electronic components 84, any surrounding electronic components 86 outside of the frame 412, and/or the PCB 82 itself as cutting need not occur. Further, should maintenance of the electronic device 80 inadvertently damage the cover 316 of the EMI shield 410, a new cover can be used to easily replace the damaged cover with minimal impact to any surrounding electronic components 86.

Similar to the frame 412, the cover 316 of the EMI shield 410 may comprise sheet metal or metal screen. The sheet metal or metal screen may comprise metal, including, but not limited to copper, brass, nickel, silver, steel, tin, and alloys including the same.

The example implementations described herein realized no observed degradation (i.e., less than 1 dB) as opposed to an EMI shield having an uncovered opening adjacent a concave corner, as a result of die stamping, which recorded a 6-7 dB degradation in the 2.4 Ghz band.

Turning now to FIGS. 10 and 11, aspects of the manufacture of the EMI shields described herein are described in greater detail. As noted above, the frame and/or cover of the EMI shields described herein, such as the EMI shields 10, 110, 210, 310, and 410 may be formed by cutting a metal sheet to form a flat blank and then bending portions of the blank to form the ultimate shape of the frame and/or cover. FIGS. 10 and 11, for convenience, illustrate examples of cut blanks 110' and 210' that will become the frames 112 and 212, respectively. In other words, the cut blanks 110' and 210' correspond to the frames 112 and 212 in a stage of manufacture after being cut from a sheet but prior to being bent to include vertical walls 120 or 220. The illustration of FIG. 10 shows a blank 110' that corresponds with the EMI shield 110 of FIGS. 2-5, whereas the illustration of FIG. 11 shows a blank 210' that corresponds with the EMI shield 210 of FIG. 6. It should be understood that the principles described below in relation to FIGS. 10 and 11 would also be applicable to blanks and frames having other shapes and configurations, and that the blanks 110' and 210' are used merely as examples to illustrate these principles. It should also be understood that the covers of EMI shields may be formed in a similar manner as the frames (except that the covers may lack a central aperture) and thus the principles described below may be applicable to the formation of covers of EMI shields.

The cut blanks 110' have a planar shape and include a central portion 118' as well as a plurality of tabs 120' integrally coupled to and laterally extending from the central portion 118'. As described in greater detail below, the central portion 118' corresponds to (i.e., will eventually become) the horizontal body 118 in the finished frame 110 and the tabs 120' correspond to (i.e., will eventually become) the vertical walls 120 in the finished frame 110. The plurality of tabs 120' is disposed around a perimeter of the central portion 118'. Each of the plurality of tabs 120' extends laterally from a respective side of the central portion 118'. In this stage of manufacture, the tabs 120' are parallel to the central portion 118'; in other words, in this state the entire blank 110' (including the tabs 120' and the central portion 118') lies within the same plane (neglecting the thickness of the sheet for ease of description). The plurality of tabs 120' includes a first tab 124' and a second tab 138'. The first tab 124' extends from a first side 524 of the central portion 118'. The first side 524 defines a future fold which forms the first vertical wall 124. The second tab 138' extends from a second side 528 of the central portion 118'. The second side 528 defines a future fold which forms the second vertical wall 138. The first and second sides 524, 528 of the central portion 118', in part, define a concave corner 122'. The first tab 124' includes an attached portion 126' directly connected to the central portion 118' and an extension portion 128' directly connected to the attached portion 126' at a first axis 150'. As illustrated, the first tab 124' does not extend to the second side 528 of the central portion 118' due to the second tab 138' occupying the space between.

As will be described in greater detail below, the plurality of tabs 120' are bent along the first and second sides 524, 528 of the central portion 118' of the cut blank 110' to form a frame 112, of the EMI shield 110, which is illustrated in FIGS. 2-5.

In some examples, the central portion 118' comprises (defines) a central void 114', which corresponds to (i.e., will eventually become) the central aperture 114 in the finished frame 110.

An example implementation of a method of manufacturing the EMI shield, such as EMI shield 110, will now be described. Metal is provided in the form of sheet metal or metal screen. The metal may include, but is not limited to copper, brass, nickel, silver, steel, tin, and alloys including the same. The metal is machined into a cut blank 110' having a planar shape comprising a central portion 118' that defines a central void 114' and a plurality of tabs 120' disposed about the perimeter of the central portion 118'. The central portion 118' and the plurality of tabs 120' are unitary and integral with one another.

The tabs are formed to extend laterally from respective sides of the central portion 118'. A first tab 124' is formed to extend from a first side 524 of the central portion 118' and a second tab 138' is formed to extend from a second side 528 of the central portion 118'. The first and second sides 524, 528 are adjacent one another and define, in part, a concave corner 122'. The first tab 124' includes an attached portion 126' directly connected to the central portion 118' and an extending portion 128' directly connected to the attached portion 126' along a first axis 150'. The first tab 124' does not extend to the second side of the central portion 118' since the second tab 138' is disposed between the first tab 124' and the second side 528. The plurality of tabs 120' are bent approximately perpendicular relative to the central portion 118', along the respective sides of the central portion 118'. A horizontal body 118 is formed from the central portion 118' and a plurality of vertical walls 120 are formed from the plurality of tabs 120'. As alluded to, the plurality of vertical walls 120 extends perpendicularly from the horizontal body 118 and, in part, define a perimeter of a frame 112 of the EMI shield 110. The perimeter includes a first vertical wall 124 and a second vertical wall 138 of the plurality of vertical walls 120. The first vertical wall 124 and the second vertical wall 138 are respectively formed from the first tab 124' and the second tab 138'. The extending portion 128' of the first tab 124' is bent relative to the attached portion 126' of the first tab 124' about one of more fold axes 150', 156' to form an attached portion 126 and an extension portion 128 of the first vertical wall 124, respectively. The extension portion 128 of the first vertical wall 124 extends beyond the attached portion 126 of the first vertical wall 124 toward the second vertical wall 138. In some implementations, the extension portion 128 of the first vertical wall 124 extends beyond the attached portion 126 of the first vertical wall 124 to abut the second vertical wall 138

Bending the plurality of tabs 120' results in forming an opening 140 that corresponds to a region occupied by an end of the second tab 138' prior to the second tab 138' being bent to form the second vertical wall 138. The opening 140 is, in part, defined between a first end 130 of the attached portion 126 of the first vertical wall 124 and the second vertical wall 138. In some example implementations, the extension portion 128 includes a first portion 160 that is bent relative to the attached portion 126 about a first fold 150 defined by a first axis 152 and the extension portion 128 further includes a second portion 166 bent relative to the first portion 160 about a second fold 154 defining a second axis 156 different than the first axis 152. In these examples, the second portion 166 of the extension portion extends parallel to and protrudes beyond the first end 130 of the attached portion 126 to at least partially cover the opening 140. In other examples, the second portion 166 covers the entire opening 140 and abuts the second vertical wall 138.

Those example implementations having the first and second folds 150, 154 may also have the first and second axes 152, 156 such that the first and second axes are not parallel. In some examples, the first fold 150 and the first axis 152 are disposed at either a 45° or 135° angle relative to a longitudinal axis of the first tab 124'. Additionally, the second fold 154 and the second axis 156 are disposed at a 90° angle relative to a longitudinal axis of the first tab 124'. In other examples which include more than two folds (not shown), it is contemplated that other angles could be utilized to ensure the extension portion 128 extends past the attached portion 126 and is positioned closer to the second vertical wall 138 than the attached portion 126.

Turning now to FIG. 11, another example implementation of a method of manufacturing the EMI shield, such as EMI shield 210 will now be described. Metal is provided in the form of sheet metal or metal screen. The metal may include, but is not limited to copper, brass, nickel, silver, steel, tin, and alloys including the same. The metal is machined into a blank 210' having a planar shape comprising a central portion 218' that defines a central void 214' and a plurality of tabs 220' disposed about the perimeter of the central portion 218'. The central portion 218' and the plurality of tabs 220' are unitary and integral with one another.

The blank 210' is one example configuration of the blank 110' described above and thus some components of the blank 210' are similar to (e.g., specific configurations of) components of the blank 110' described above. Similar components are referred to using the same last two digits, such as 120' and 220'. The descriptions of components of the blank 110' are applicable to the similar components of the blank 210', and thus duplicative description of various aspects already described above may be omitted below. Although the blank 210' is one configuration of the blank 110', the blank 110' and the components thereof are not limited to the blank 210' and the components thereof. The blank 210' may differ from the blank 110' primarily in the configuration of their respective extending portions 128' and 228'. In particular, the extending portion 228' of the first tab 224' of the blank 210' is connected to an opposite end of the attached portion 226' of the first tab 224' relative to where the extending portion 128' is connected to the attached portion 126 of the first tab 124". In this example, the extending portion 228' is longer than the attached portion 226' and is folded a single time along a first fold 250' defining a first axis 252' so that the extending portion 228' at least partially overlays' and extends past the attached portion 226'. For convenience, the illustration of FIG. 6 depicts the extension portion 228 as being positioned further from the central aperture 214 than the attached portion 226. However, in other examples the extending portion 228' is folded in an opposite manner such that the extending portion 228' is positioned closer the central aperture 214' than the attached portion 226' (not shown). In these examples, the first fold 250' and the first axis 252' are disposed at a 90° angle relative to the longitudinal axis of the extending portion 228'. Further, in these examples, the extending portion 228' is not subdivided into different portions or subject to any additional folds other than the first fold 250'.

Machining the metal sheet, bending the plurality of tabs 120' or 220', and bending the extending portion 128' or 228', respectively, may comprise stamping or die stamping. By bending the extending portions 128' or 228' of the first plurality of tabs 120' or 220' provided for vertical wall 124 or 224, including extension portion 128 or 228, to at least partially cover the opening 140 or 240 corresponding to the former location of the second tab 138' or 238', a reduction in EMI passing through the opening 140 or 240 is realized. This method has the further benefit of reducing manufacturing costs and eliminating additional steps like applying a separate EMI blocking component, e.g., EMI foams and pastes. The frame 112 or 212 of the EMI shield 110 or 210 is configured to be fixedly coupled to the electronic device 80 or the PCB 82. In some other examples, the EMI shield may include the cover 316 that is configured to be removably coupled to the frame 112, 212, or 412 so as to simplify maintenance and upgrading of the electronic device 80 or PCB 82. Implementation of these examples includes removably coupling the cover 316 to the frame 112, 212, or 412, removing the cover 316 from the frame 112, 212, or 412, performing maintenance or upgrade procedures, and replacing the cover 316 by removably coupling the cover 316 to the frame 112, 212, or 412. The cover 316 being removably coupled to the frame also reduces the likelihood of inadvertently damaging the one or more electronic components 84, any surrounding electrical components 86 disposed on the PCB 82, or even the PCB 82.

In other examples, sheet metal is provided to machine a frame 112, 212, or 412 that is configured to be fixedly coupled to a PCB 82 wherein the EMI shield 110, 210, or 410 further includes a cover 316 that is configured to be removably coupled to the frame 112, 212, or 412.

In some example implementations, the cover 316 can be formed in a similar manner as described with respect to the frame 112, 212, or 412. In these examples, the cover 316 would originate from a blank having a central portion and a plurality of tabs extending therefrom, with the plurality of tabs being bent to form a plurality of vertical walls. The blank associated with the cover 316 may differ from the blanks 110' and 210' in that the central portion of the blank associated with the cover does not include a central void.

In the description above, various types of electronic circuitry or devices are described. As used herein, "electronic" is intended to be understood broadly to include all types of circuitry/devices utilizing electricity, including digital and analog circuitry, direct current (DC) and alternating current (AC) circuitry, and circuitry/devices for converting electricity into another form of energy and circuitry/devices for using electricity to perform other functions. In other words, as used herein there is no distinction between "electronic" circuitry/devices and "electrical" circuitry/devices. In some cases, certain electronic circuitry/devices may comprise processing circuitry. Processing circuitry comprises circuitry configured with logic for performing various operations. The logic of the processing circuitry may comprise dedicated hardware to perform various operations, software (machine readable and/or processor executable instructions) to perform various operations, or any combination thereof. In implementations in which the logic comprises software, the processing circuitry may include a processor to execute the software instructions and a memory device that stores the software. The processor may comprise one or more processing devices capable of executing machine readable instructions, such as, for example, a processor, a processor core, a central processing unit (CPU), a controller, a microcontroller, a system-on-chip (SoC), a digital signal processor (DSP), a graphics processing unit (GPU), etc. In cases in which the processing circuitry includes dedicated hardware, in addition to or in lieu of the processor, the dedicated hardware may include any electronic device that is configured to perform specific operations, such as an Application Specific Integrated Circuit (ASIC), a Field Programmable Gate Array (FPGA), a Complex Programmable Logic Device (CPLD), discrete logic circuits, a hardware accelerator, a hardware encoder, etc. The processing circuitry may also include any combination of dedicated hardware and processor plus software.

It is to be understood that both the general description and the detailed description provide example implementations that are explanatory in nature and are intended to provide an understanding of the present disclosure without limiting the scope of the present disclosure. Other examples in accordance with the present disclosure will be apparent to those skilled in the art based on consideration of the disclosure herein. For example, various mechanical, compositional, structural, electronic, and operational changes may be made to the disclosed examples without departing from the scope of this disclosure, including for example the addition, removal, alteration, substitution, or rearrangement of elements of the disclosed examples, as would be apparent to one skilled in the art in consideration of the present disclosure. Moreover, it will be apparent to those skilled in the art that certain features or aspects of the present teachings may be utilized independently (even if they are disclosed together in some examples) or may be utilized together (even if disclosed in separate examples), whenever practical. In some instances, well-known circuits, structures, and techniques have not been shown or described in detail in order not to obscure the examples. Thus, the following claims are intended to be given their fullest breadth, including equivalents, under the applicable law, without being limited to the examples disclosed herein.

References herein to examples, implementations, or other similar references should be understood as referring to prophetic or hypothetical examples, rather than to devices/systems that have been actually produced, unless explicitly indicated otherwise. Similarly, references to qualities or characteristics of examples should be understood as representing the educated estimates or expectations of the inventors based on their understanding of the relevant principles involved, application of theory and/or modeling, and/or past experiences, rather than as being representations of the actual qualities or characteristics of an actually produced device/system or the empirical results of tests actually carried out, unless explicitly indicated otherwise.

Further, spatial, positional, and relational terminology used herein is chosen to aid the reader in understanding examples of the invention but is not intended to limit the invention to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Furthermore, if a different reference frame is considered than the one illustrated in the figures, then the spatial terms used herein may need to be interpreted differently in that different reference frame. Moreover, the poses of items illustrated in the figure are chosen for convenience of illustration and description, but in an implementation in practice the items may be posed differently.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition. Moreover, unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

What is claimed is:

1. An electromagnetic interference (EMI) shield, comprising:
    a frame configured to be coupled to a printed circuit board (PCB) and laterally surround an electronic component on the PCB, the frame comprising:
        a horizontal body;
        a plurality of vertical walls connected to and extending perpendicularly from the horizontal body to define a perimeter of the frame;
    wherein the perimeter of the EMI shield comprises a concave corner defined in part by a first vertical wall and a second vertical wall of the plurality of vertical walls;
    wherein the first vertical wall comprises an attached portion connected directly to the horizontal body and an extension portion connected to the attached portion by a first fold; and
    wherein the extension portion at least partially overlays and extends beyond the attached portion toward the second wall.

2. The EMI shield of claim 1, wherein the attached portion has a first end adjacent the second vertical wall and a second end opposite the first end and spaced farther from the second vertical wall than is the first end of the attached portion; and
    wherein the first end of the attached portion is spaced apart from the second vertical wall such that there is an opening at the concave corner between the attached portion and the second vertical wall, and
    wherein the extension portion extends beyond the first end of attached portion toward the second vertical wall and at least partially covers the opening.

3. The EMI shield of claim 2, wherein the extension portion covers the entire opening and a free end of the extension portion abuts the second vertical wall at the concave corner.

4. The EMI shield of claim 2, wherein the extension portion has an attached end and a free end spaced from and opposite the attached end of the extension portion;
    wherein the attached end of the extension portion is connected to the first end of the attached portion by the first fold.

5. The EMI shield of claim 4, wherein the extension portion comprises:
    a first portion extending from the first fold to a second fold; and
    a second portion extending from the second fold to the free end of the extension portion; and
    wherein the first and second portions both at least partially overlay the attached portion, and the second portion at least partially overlays the first portion.

6. The EMI shield of claim 5, wherein the first fold is folded along a first fold axis and the second fold is folded along a second fold axis, and the first and second fold axes are not parallel to one another.

7. The EMI shield of claim 2, wherein the extension portion has an attached end and a free end spaced from and opposite the attached end of the extension portion; and
    wherein the attached end of the extension portion is connected to the second end of the attached portion by the first fold.

8. The EMI shield of claim 2, wherein the horizontal body and the plurality of vertical walls are unitary and formed from a same sheet of material with the vertical walls bent relative to the horizontal body, and wherein the opening corresponds to a region occupied by an end of the second vertical wall prior to the second wall being bent.

9. The EMI shield of claim 1, wherein the horizontal body defines a central aperture.

10. The EMI shield of claim 1, wherein the EMI shield comprises a cover configured to be removably coupled to the frame.

11. An electronic device comprising:
    a printed circuit board (PCB);
    an electromagnetic interference (EMI) shield comprising:
        a frame coupled to the PCB and laterally surrounding at least one electronic component on the PCB; and
        a horizontal body;
            a plurality of vertical walls connected to and extending perpendicularly from the horizontal body to define a perimeter of the frame;
    a cover configured to be removably coupled to the frame and, when coupled to the frame, cover at least part of the frame and the at least one electronic component;
    and wherein the perimeter of the EMI shield comprises a concave corner defined in part by a first vertical wall and a second vertical wall of the plurality of vertical walls;
    wherein the first vertical wall comprises an attached portion connected directly to the horizontal body and an extension portion connected to the attached portion by a first fold; and
    wherein the extension portion at least partially overlays the attached portion and extends beyond the attached portion toward the second wall.

12. The electronic device of claim 11, wherein the attached portion has a first end adjacent the second wall and a second end opposite the first end and spaced farther from the second wall than is the first end of the attached portion; and
    wherein the first end of the attached portion is spaced apart from the second vertical wall such that there is an opening at the concave corner between the attached portion and the second vertical wall, and wherein the extension portion extends beyond the first end of attached portion toward the second wall and at least partially covers the opening.

13. The electronic device of claim 12, wherein the extension portion covers the entire opening and a free end of the extension portion abuts the second vertical wall at the concave corner.

14. The electronic device of claim 13, wherein the extension portion has an attached end and a free end spaced from and opposite the attached end of the extension portion; and
wherein the attached end of the extension portion is connected to the second end of the attached portion by the first fold.

15. The electronic device of claim 13, wherein the horizontal body and the plurality of vertical walls are unitary and formed from a same sheet of material with the vertical walls bent relative to the horizontal body, and wherein the opening corresponds to a region occupied by an end of the second vertical wall prior to the second wall being bent.

16. The electronic device of claim 12, wherein the extension portion has an attached end and a free end spaced from and opposite the attached end of the extension portion;
wherein the attached end of the extension portion is connected to the first end of the attached portion by the first fold.

17. The electronic device of claim 16, wherein the extension portion comprises:
a first portion extending from the first fold to a second fold; and
a second portion extending from the second fold to the free end of the extension portion; and
wherein the first and second portions both at least partially overlay the attached portion, and the second portion at least partially overlays the first portion.

18. The electronic device of claim 17, wherein the first fold is folded along a first fold axis and the second fold is folded along a second fold axis, and the first and second fold axes are not parallel to one another.

19. The electronic device of claim 11, wherein the horizontal body defines a central aperture.

20. A method of manufacturing an electromagnetic interference (EMI) shield, comprising:
providing a metal sheet;
machining the metal sheet to form a planar shape comprising a central portion defining a central aperture and a plurality of tabs around a perimeter of the central portion, the tabs integrally coupled to and extending laterally from respective sides of the central portion, wherein a first tab of the plurality of tabs comprises an attached portion connected directly to a first side of the central portion and an extending portion connected to an end of the attached portion, wherein a second tab of the plurality of tabs is connected to a second side of the central portion, wherein the first and second sides of the central portion are adjacent to one another and define a concave corner;

bending the plurality of tabs relative to the central portion along the respective sides of the central portion to form a horizontal body from the central portion and to form a plurality of vertical walls from the plurality of tabs, the plurality of vertical walls extending perpendicularly from the horizontal body and defining a perimeter of the EMI shield, wherein the perimeter includes a first wall and a second wall respectively formed from the first tab and the second tab; and bending the extending portion relative to the attached portion about one of more fold axes such that a portion of the extending portion overlays the attached portion and the extending portion extends past the attached portion toward the second wall.

21. The method of claim 20, wherein the step of bending the plurality of tabs comprises forming an opening that corresponds to a region occupied by an end of the second tab prior to the second tab being bent to form the second wall, wherein the opening is defined in part between a first end of the first wall and the second wall.

22. The method of claim 21, wherein the step of bending the extending portion comprises bending a first section of the extending portion relative to the attached portion about a first fold axis and bending a second section of the extending portion about a second fold axis, the first and second fold axes are not parallel to one another, such that the second section of the extending portion extends parallel to and protrudes beyond the first end of the attached portion to at least partially cover the opening.

23. The method of claim 20, wherein the steps of machining the metal sheet, bending the plurality of tabs, and bending the extending portion each comprise stamping.

* * * * *